United States Patent
Tanaka et al.

(10) Patent No.: US 6,979,525 B2
(45) Date of Patent: Dec. 27, 2005

(54) METHOD OF MANUFACTURING ELECTRONIC DEVICE

(75) Inventors: Toshihiko Tanaka, Tokyo (JP); Takashi Tattori, Musashimurayama (JP)

(73) Assignee: Renesas Technology Corp., Tokyo (JP)

( * ) Notice: Subject to any disclaimer, the term of this patent is extended or adjusted under 35 U.S.C. 154(b) by 218 days.

(21) Appl. No.: 10/319,651

(22) Filed: Dec. 16, 2002

(65) Prior Publication Data

US 2003/0165750 A1    Sep. 4, 2003

(30) Foreign Application Priority Data

Mar. 1, 2002    (JP)  ............................ P2002-055166

(51) Int. Cl.⁷ ................................................ G03F 7/20
(52) U.S. Cl. ..................................... 430/311; 430/396
(58) Field of Search .................. 430/5, 11, 30, 311, 430/394, 396; 356/393, 394; 716/19–21

(56) References Cited

U.S. PATENT DOCUMENTS

| | | | | | |
|---|---|---|---|---|---|
| 4,586,822 | A | * | 5/1986 | Tanimoto | .................... 356/394 |
| 5,925,484 | A | * | 7/1999 | Shima et al. | ................... 430/7 |
| 5,935,736 | A | * | 8/1999 | Tzu | ................................. 430/5 |
| 6,048,647 | A | * | 4/2000 | Miyazaki et al. | ............... 430/5 |
| 6,214,497 | B1 | * | 4/2001 | Stanton | ......................... 430/5 |
| 6,746,812 | B2 | * | 6/2004 | Watanabe et al. | ........... 430/165 |

FOREIGN PATENT DOCUMENTS

| | | | |
|---|---|---|---|
| JP | 56-030129 | * | 3/1981 |
| JP | 59-022050 | * | 2/1984 |
| JP | 6-308715 | | 4/1993 |
| JP | 05-289307 | * | 11/1993 |
| JP | 9-90601 | | 2/1996 |
| JP | 11-15130 | | 6/1997 |

* cited by examiner

*Primary Examiner*—Kathleen Duda
(74) *Attorney, Agent, or Firm*—Reed Smith LLP; Stanley P. Fisher, Esq.; Juan Carlos A. Marquez, Esq.

(57) ABSTRACT

A method of manufacturing an electronic device that includes the step of forming a pattern on a substrate by using a halftone phase shift mask where the halftone phase shift mask includes a translucent phase shift pattern having an aperture; and an auxiliary pattern, disposed near the aperture and having as a principal component an organic film which possesses a light attenuating property or a light shielding property against exposure light. The halftone phase shift mask fabricating Turn-Around-Time (TAT) is shortened thereby shortening the development time required for an electronic device, the production cost of which has also been reduced.

39 Claims, 18 Drawing Sheets

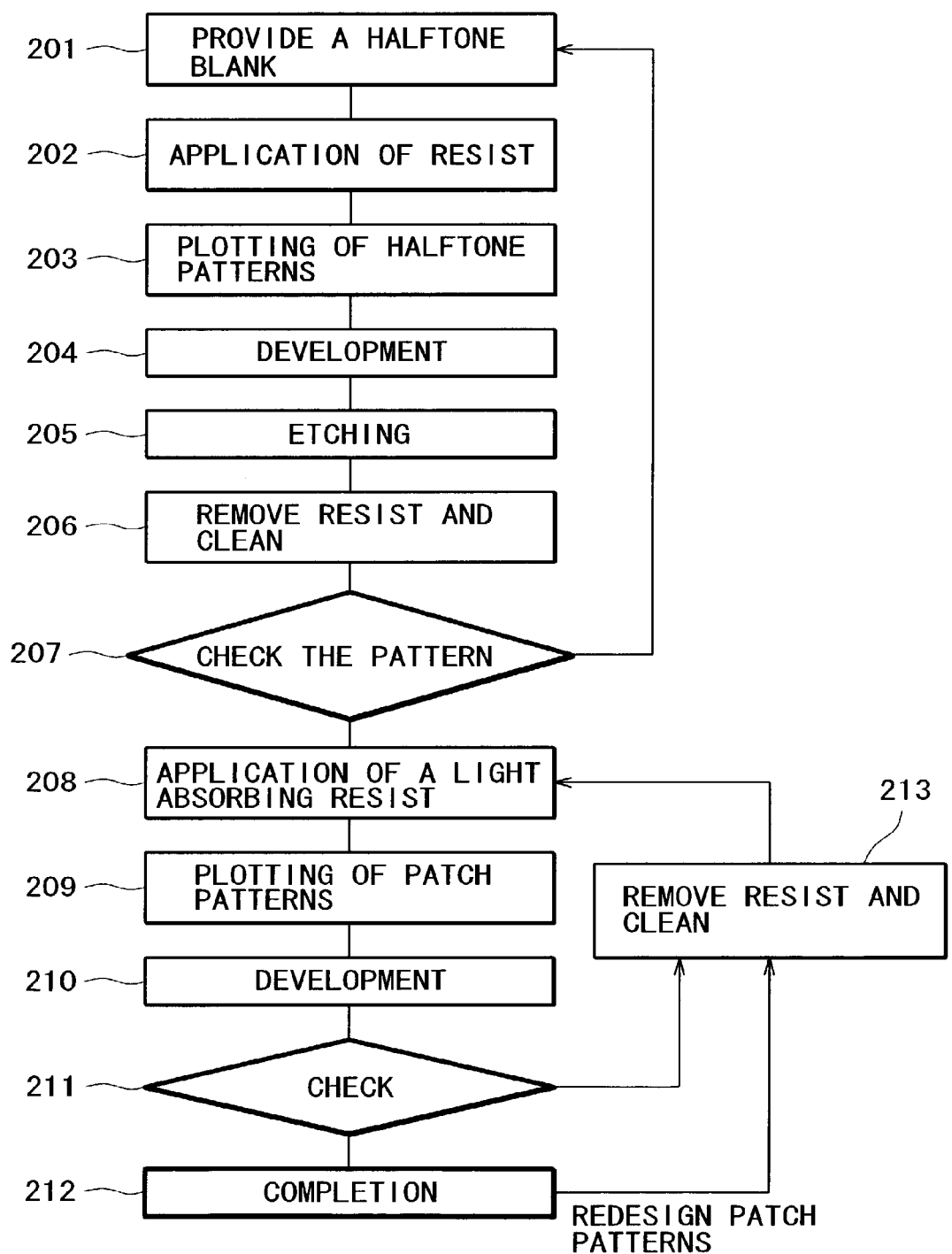

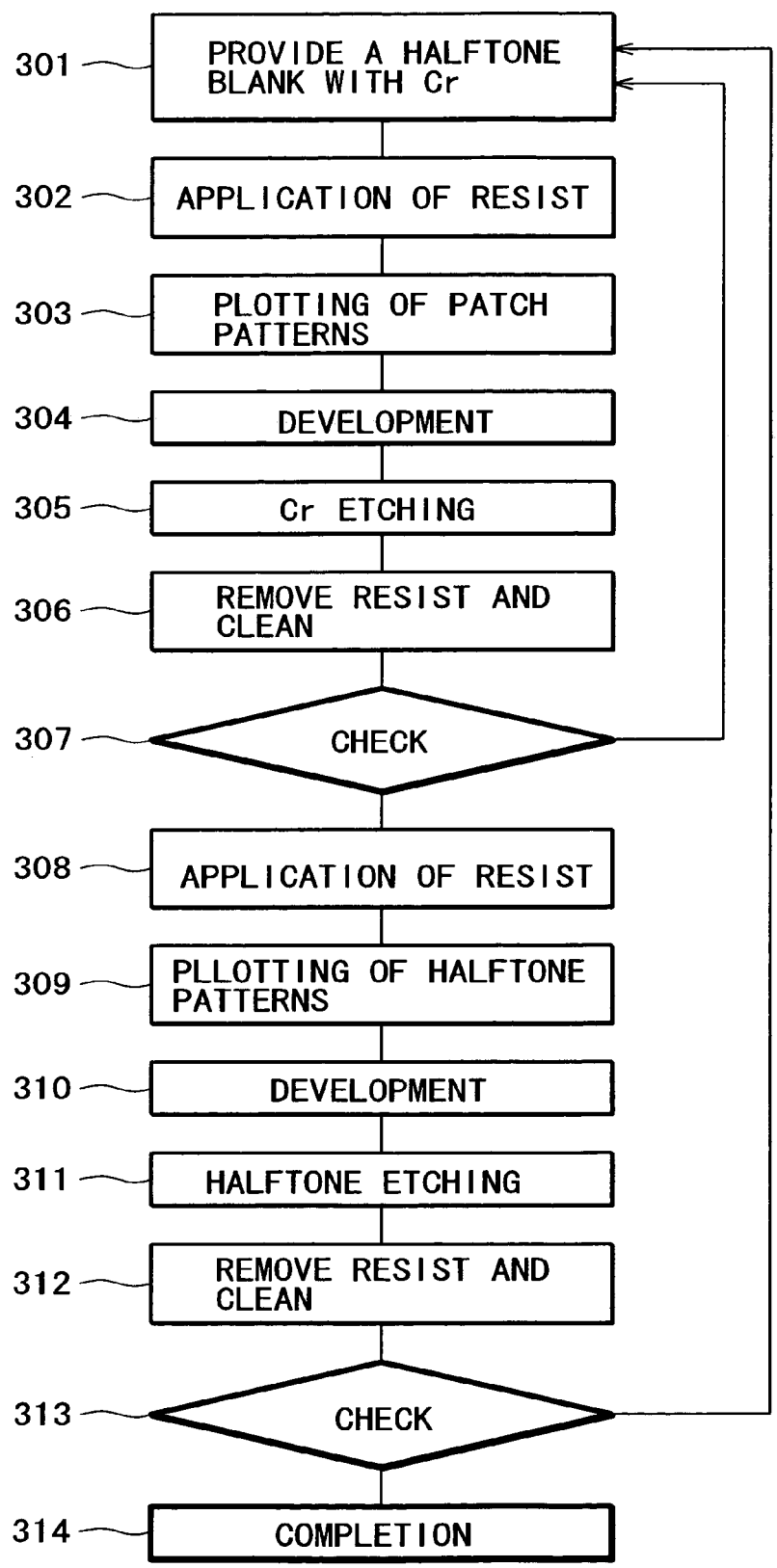
Prior Art  FIG. 5

METHOD OF MANUFACTURING ELECTRONIC DEVICE

BACKGROUND OF THE INVENTION

1. Field of the Invention

The present invention relates to a method of manufacturing an electronic device having a fine pattern such as a semiconductor device or a wiring substrate device.

2. Description of Related Art

In fabricating a semiconductor circuit, there are repeatedly employed a film forming step such as CVD (Chemical Vapor Deposition), an impurity layer forming step such as ion implantation, a lithography step for forming a resist pattern, and an etching step. Microsizing a circuit pattern and improving the dimensional accuracy of the circuit pattern are effective as a method for improving the operating speed of a semiconductor circuit or improving the degree of device integration. Recently, both microsizing and improvement of dimensional accuracy have been promoted actively. The microsizing of a pattern mainly depends on lithography, so lithography now occupies an extremely important position in the manufacture of a semiconductor device.

In the lithography technique, a projection exposure system is primarily used. A pattern of a photomask mounted to the projection exposure system is transferred onto a semiconductor wafer to form a device pattern.

To meet the recent demand for higher device integration and a higher device operation speed, the microsizing of the pattern has been promoted. With this as background, an exposure method called a halftone phase shift method is employed. The halftone phase shift method indicates a mask wherein a film (called a halftone film) translucent to exposure light is formed on a transparent substrate (blank). The transmittance through the film of exposure light is adjusted usually to a value in the range from 1% to 25%. Exposure light for passing through the film is adjusted so as to be phase-inverted in the absence of the film. A phase difference which brings about the highest resolving performance is 180° or an odd-number multiple thereof. But insofar as the phase difference is inside of 90° above and below 180°, there is obtained a resolution improving effect. It is generally known that the use of the halftone phase shift mask brings about an improvement of approximately 5% to 20% in resolution. Particularly, the higher the transmittance of the halftone film, the more outstanding the phase enhancing effect, i.e., the higher the resolution becomes. On the other hand, an image called a sub peak is apt to be formed in a field portion which should be a light shielding portion, and causes a transfer defect. This is a phenomenon caused by simultaneous enhancement of the phase of interference light from an adjacent pattern and that of light transmitted through the field portion. In this regard, reference will be made to an example of sub peak resulting from interference in a mutually enhancing direction of light rays emitted from four positions, called quadrupole. An example of a pattern layout as seen in plan in quadrupole is shown in FIG. 20A and a section taken on line A–A' is shown in FIG. 20B. In these figures, the reference numeral 100 denotes quartz glass (blank), numeral 101 denotes a halftone film, and numeral 103 denotes a circuit pattern. FIG. 14 shows an optical transfer image corresponding to the range from B to B' in FIG. 20B. It is seen that the higher the transmittance of the halftone mask member, the larger the sub peak. To suppress this phenomenon, there is adopted a method wherein in the case of a high-transmittance halftone phase shift mask with a relatively high transmittance of a halftone film, a fine light shielding pattern is formed using Cr on a portion of the halftone film corresponding to a sub peak pattern generated position, thereby cutting off the transmitted light in that portion. This method is called a tri-tone halftone phase shift method because three tones are used which are a transmitting portion (glass portion), a halftone portion, and a light shielding portion (Cr portion).

Descriptions on the tri-tone halftone phase shift are found, for example, in JP-A No.15130/1999, JP-A No.308715/1994, and JP-A No.90601/1997.

For providing a method of manufacturing an LSI of high integration and/or high-speed operation, it is necessary that a circuit pattern of fine dimensions be formed with a high dimensional accuracy. Therefore, a tri-tone halftone phase shift method having a high resolution is required to attain a high dimensional accuracy and a high phase control accuracy. In a halftone phase shift exposure method, exposure light which has passed through a halftone portion and exposure light which has passed through an aperture interfere with each other in the vicinity of a boundary between the aperture and the halftone portion to enhance the optical contrast and thereby improve the resolution and exposure latitude. Therefore, controlling the quantity of exposure light passing through the halftone portion, i.e., controlling the transmittance in the halftone portion, and phase control, are extremely important. Further, the pattern size accuracy of a halftone film greatly influences the dimensional accuracy of the pattern transferred. In a fine pattern near a resolution limit of a projection lens, the optical contrast decreases to a large extent due to optical diffraction, so that there arises a factor called MEF (Mask Error enhance Factor), which causes deterioration in dimensional accuracy of the transferred pattern to a greater extent than the dimensional accuracy of pattern on the mask. MEF is an index indicating to what degree a dimensional difference $\Delta Lm$ of the transferred pattern is amplified relative to a dimensional difference $\Delta Lw$ on the mask. It is represented by the following equation in which the reduction ratio of the projection lens is assumed to be M. For example, in case of using a 5× lens, the value of M becomes ⅕.

$$MEF = \Delta Lm/(M \cdot \Delta Lw)$$

In the case of such a fine pattern as used in a halftone phase shift mask, the value of MEF is usually in the range from 2 to 3, that is, variations in mask size are amplified from 2M to 3M and in this state there is made the transfer of pattern is made.

Recent tri-tone halftone masks require a fine and extremely high accuracy, such as a pattern size on mask of 320 nm and a dimensional accuracy on mask of 9 nm. Therefore, the dimensional yield in this class is usually as low as 10% to 30%. That is, on the average, it is necessary that three to ten sheets of mask be fed for producing one sheet of a good mask. Thus, the cost of mask is high and the Turn Around Time (TAT) is low.

Additional factors such as the resist characteristic factor and the substrate step structure factor, the position and size of a fine light shielding pattern (auxiliary pattern) using Cr, which pattern is for preventing unnecessary image transfer caused by a sub peak, cannot be accurately anticipated by simulation. Therefore, even if a halftone phase shift film is satisfactory in point of dimensional accuracy, if it is found to be defective in the state of transfer after the fabrication of mask, it is necessary that the mask be fabricated again from the beginning. This has caused an increase in the TAT of the mask feed.

In the course of manufacturing a semiconductor device there are used about 30 sheets of photomask. One important factor of determining the semiconductor device development period is the supply of photomask, and for shortening the development period it is absolutely necessary to improve the photomask feed TAT. Further, the IC grade development is often conducted in wiring step and this grade development power also depends much on the feed TAT of the photomask for the wiring step.

SUMMARY OF THE INVENTION

The present invention provides a method of manufacturing an electronic device using a halftone phase shift mask that is formed on a halftone phase shift film and permits easy reproduction of an exposure light attenuating or shielding film.

The present invention also provides a method of manufacturing an electronic device that can shorten the semiconductor device development period and grade development period, and reduce the manufacturing cost, by using a mask produced by a method having a short mask feed TAT.

One aspect of the invention is directed to a method of manufacturing an electronic device in which a pattern is formed on a substrate by using a halftone phase shift mask, the halftone phase shift mask comprising a translucent phase shift pattern having an aperture and an auxiliary pattern disposed near the aperture and having an organic film as a principal component, the organic film possessing a light attenuating property or a light shielding property against exposure light.

Accordingly, using an organic film possessing a light attenuating or shielding property permits easy reproduction of an exposure light attenuating or shielding film by making use of ashing, without damage to the translucent phase shift film.

Another aspect is directed to a method of manufacturing an electronic device, comprising the steps of:

providing a halftone phase shift mask, the halftone phase shift mask being fabricated by the substeps comprising providing a transparent substrate with a translucent phase shift film formed thereon, forming a pattern having an aperture on the translucent phase shift film, judging whether the translucent phase shift film formed with the aperture is good or not, and forming an auxiliary pattern near the aperture of the translucent phase shift film judged to be good, the auxiliary pattern having a desired shape and having an organic film as a principal component;

mounting the halftone phase shift mask to a projection exposure system such that the surface thereof with the translucent phase shift film formed thereon faces down; and transferring the pattern formed on the halftone phase shift mask onto a substrate.

Since the formation of a halftone phase shift film pattern poor in yield is followed by quality judgment and the film possessing a light attenuating or shielding property against exposure light is formed on only the pattern judged to be good, it is possible to diminish the light shielding pattern forming step. That is, since the formation of a light shielding pattern onto the mask substrate provided with a defective halftone phase shift pattern becomes unnecessary, the light shielding pattern forming step is proportionally diminished. The degree of the diminishing is 90% if the yield of the halftone phase shift film pattern is 10%, and 70% is diminished even if the said yield is 30%.

Further, since the mask is disposed in the exposure system such that the surface thereof with the halftone phase shift film pattern formed thereon faces down, the exposure light reaches the organic film after passing through the phase shift film. Consequently, the intensity of the exposure light is decreased and the organic film is less deteriorated by the exposure light, whereby it is possible to increase the number of times the mask is used.

Other and further objects, features and advantages of the invention will appear more fully from the following description.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein:

FIG. 4 is a flow chart diagram showing a preferred mask fabricating method according to the present invention;

FIG. 5 is a flow chart diagram showing a conventional mask fabricating method;

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided herein below with reference to the attached drawings.

Before describing the invention in detail, the terms used in the invention will be defined as follows.

First, "halftone area," "halftone film," "halftone pattern," "translucent film," and "light attenuation," mean the possession of an optical characteristic which permits the passage of 1% to 25% of exposure light radiated to the area concerned.

"Light shielding area," "light shielding film," and "light shielding pattern," mean the possession of an optical characteristic which permits less than 1% transmission of exposure light radiated to the area concerned.

On the other hand, "transparent" and "transparent film" mean the possession of an optical characteristic which permits 60% or more, usually 90% or more, transmission of exposure light radiated to the area concerned.

Second, "photoresist pattern" means a film pattern obtained by patterning a photosensitive organic film in accordance with the photolithography technique.

Third, "Metal" as referred to herein means metal (mainly Cr, W, Ti, Ta) or a metallic compound (mainly WN, TiW).

First Exemplary Embodiment

Figure 1A:
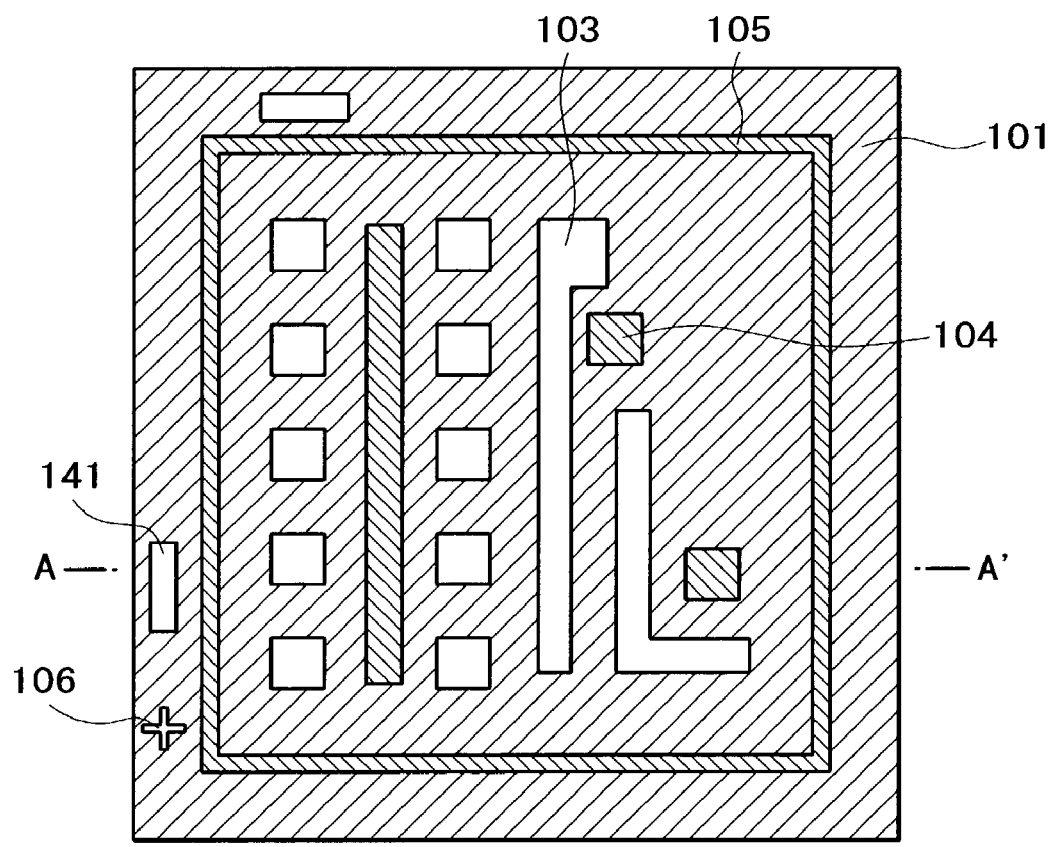
FIG. 1A is a plan view of the structure of a photomask of the present invention.
Figure 1B:
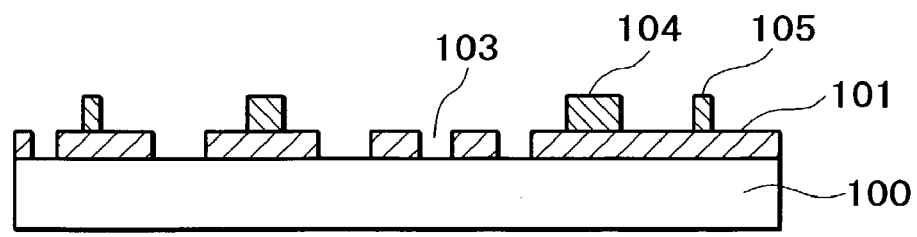
FIG. 1B is a sectional view along line A–A' of FIG. 1A.

In connection with a first exemplary embodiment of the invention, a photomask fabricating method according to the invention will now be described with reference to FIGS. 1A and 1B and FIGS. 2A and 2B. FIGS. 1A and 1B show the structures of a photomask fabricated in the first exemplary embodiment. FIG. 1A is a top view of the photomask and FIG. 1B is a sectional view taken on line A–A' in FIG. 1A.

A halftone film 101 is formed on a mask blank 100 made of quartz glass. As the mask blank 100, there also may be used optical glass and calcium fluoride crystal in addition to quartz glass. As the material of the halftone film 101, MoSix is used in this preferred embodiment, but the following materials also may be used: MoSixOy, MoSixOyNz, TaSixOy, ZrSixOy, SiNx, SiOxNy, and CrOxFy (x, y, and z are each a number in the range from 0 to 1, representing a component ratio), as well as composite films thereof. The composite films include the same type of films different in component ratio such as ZrSixOy and ZrSix'Oy'. A circuit pattern 103 is formed in an aperture shape in the halftone film. Further, as in the ordinary tri-tone halftone mask, a light shielding zone 105 and an auxiliary pattern 104 for preventing sub peak transfer are formed on the halftone film 101. The light shielding zone is formed for preventing the occurrence of abnormal resolution caused by a multiple exposure of a step boundary portion in step & repeat exposure or in step & scan exposure. A characteristic feature of the invention resides in that the auxiliary pattern 104 and the light shielding zone 105 are made of resist.

Figure 2A:
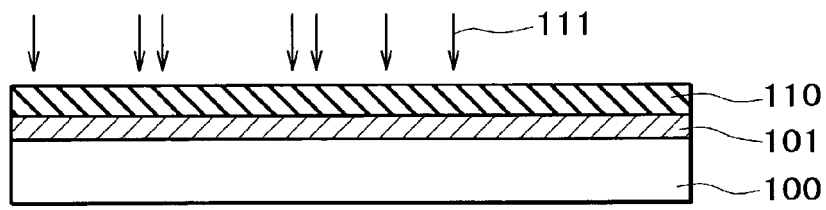
FIGS. 2A to 2F are sectional process diagrams showing a preferred mask fabricating method according to the present invention.
Figure 2B:
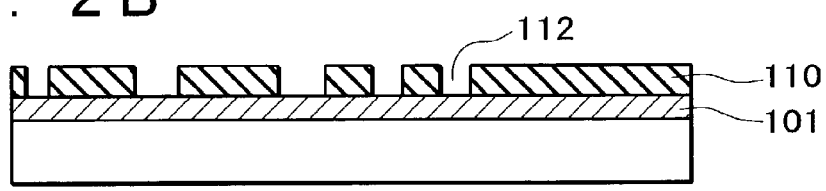
Figure 2C:
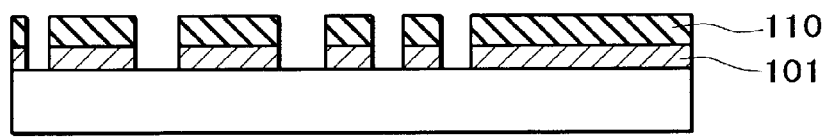
Figure 2D:
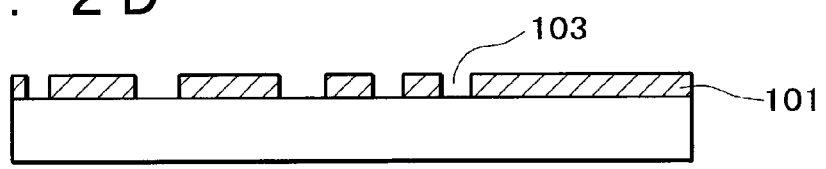
Figure 2E:
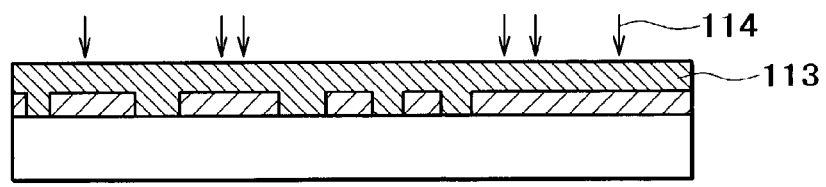

FIGS. 2A through 2F illustrate a method of manufacturing the preferred photomask shown in FIGS. 1A and 1B in terms of sectional views of manufacturing steps. As shown in FIG. 2A, a halftone film 101 is formed on a glass substrate 100 by sputtering or CVD and a resist film 110 is formed thereon. MoSiO was preferably used as the material of the halftone film. In the case where the film is for KrF lithography, a phase inversion condition is 135 nm, and if the film is formed to a thickness in the range from 133 nm to 137 nm, the phase accuracy falls within ±3° and thus it is possible to effect a highly accurate transfer. As to the resist, it is optional whether a negative resist is to be used or a positive resist is to be used. But in the case of a tri-tone halftone mask there usually is employed a positive resist in relation to exposure area. Then, a desired circuit pattern (incl. OPC: Optical Proximity effect Correction) is exposed. At the time of the exposure, there also is exposed a pattern of a plotting alignment mark 106 shown in FIG. 1A. As exposure light, there was used electron beam (EB) 111. UV light having a wavelength of 365nm or DUV light having a wavelength of 248 nm may also be used as the exposure light. Electron beam is suitable for the formation of a fine pattern and light is effective in shortening the exposure time. Thereafter, an ordinary development is performed as shown in FIG. 2B to form a resist pattern 112 having the circuit pattern. Subsequently, as shown in FIG. 2C, the pattern formed in the resist 110 is transferred to the halftone film 101 by etching. Then, as shown in FIG. 2D, the resist is removed, followed by cleaning, to fabricate a mask having the circuit pattern 103 formed in the halftone film 101. Next, as shown in FIG. 2E, a resist 113 is formed and exposure is made, as indicated at 114, for both light shielding zone pattern and auxiliary pattern. Both patterns are characterized by being isolated patterns. The exposure is performed at a desired position while making reference to the position of the plotting alignment mark 106 (see FIG. 1A) which has already been formed in the halftone film. As the resist 113, there is used a negative resist. With the negative resist, there accrues an advantage such that the exposure area is small and the drawing time becomes shorter. Moreover, the halftone film aperture (the portion of 103) is basically a thick resist portion and is stepped, but a negative tone permits that portion to be removed by only development without performing exposure, so there does not arise the problem of remaining resist which is caused by insufficient exposure. Here, as the resist, there is used a resist possessing a light shielding or attenuating property against exposure light which is used at the time of printing the photomask to wafer. For example, in the case where the exposure light is ArF excimer laser beam having a wavelength of 193 nm, it is suitable to use a resist having a benzene ring structure, e.g., a resist using a phenolic resin or a novolak resin as a base resin. Where the exposure light is KrF excimer laser beam having a wavelength of 248 nm, it is suitable to use a resin with anthracene, naphthalene, phenanthrene, or a derivative thereof, bonded thereto, or a photosensitive composition wherein anthracene, naphthalene, phenanthrene, or a derivative thereof, is mixed with a resist resin. These are suitable because of having sufficient absorption.

Figure 2F:
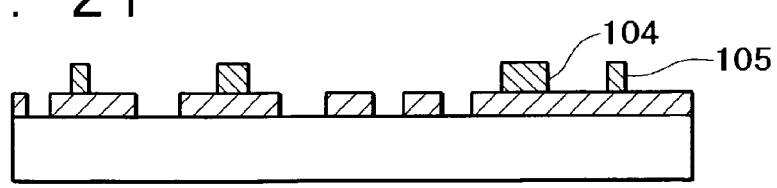

There may be used not only resist but also such a photosensitive composition as a black matrix with a radical forming agent incorporated therein which radical forming agent forms radicals against electron beam or light. The expression "photosensitive" as used herein means photosensitivity to not only light but also electron beam (EB). EB was used here as the exposure light in the exposure 114 for the light shielding zone pattern and auxiliary pattern. Light may be used instead. In case of using EB, the application of a water soluble conductive film is effective for avoiding the problem of charge-up. Thereafter, as shown in FIG. 2F, development is made to fabricate a tri-tone halftone mask having both auxiliary pattern 104 and light shielding zone 105 comprising resist film. In FIG. 1A, a mask alignment mark (reticle alignment mark) for a stepper is formed by forming an aperture in the halftone film. However, with a combination of a partial stepper and the halftone material, there sometimes occurs a case where the mark cannot be detected with a high accuracy due to an excessive transmittance of the halftone material relative to the mark detection wavelength of the stepper.

Figure 11:
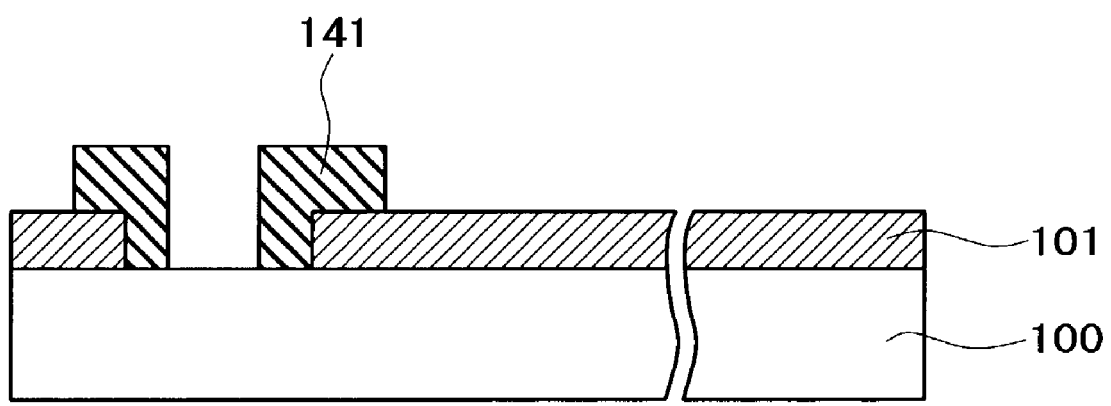
FIG. 11 is a sectional view of a principal portion of a preferred photomask of the present invention.

As shown in FIG. 11, this problem was solved by forming a reticle alignment mark 141 with use of a resist endowed with a light absorbing property also against mark detection light. FIG. 11 illustrates a sectional structure of the portion for the reticle alignment mark. In this connection, when the aperture in the halftone film 101 was retreated to a larger extent than a maximum mismatch in plotting with respect to the resist pattern aperture, the alignment accuracy was improved without interference with the aperture portion in the halftone film.

Figure 3A:
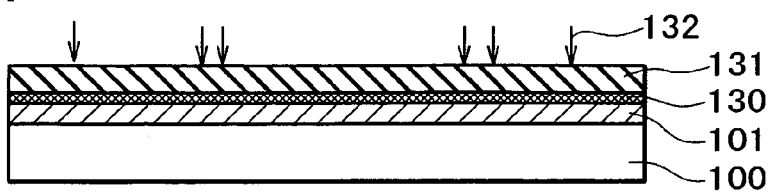
FIGS. 3A to 3H are sectional process diagrams showing a conventional mask fabricating method.
Figure 3B:
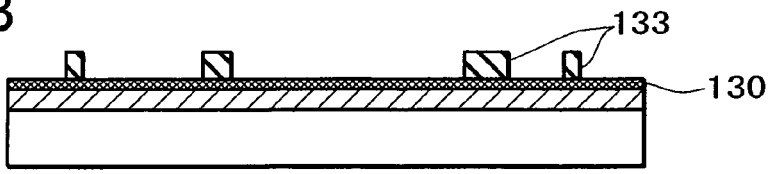
Figure 3C:
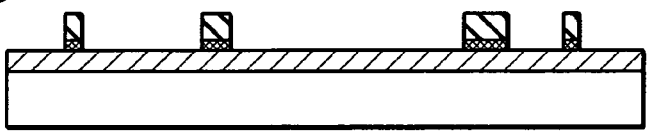
Figure 3D:
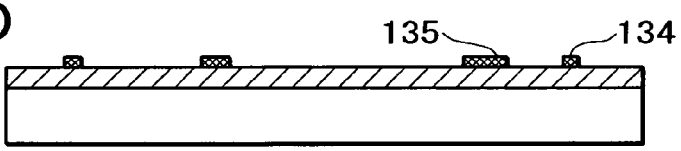
Figure 3E:
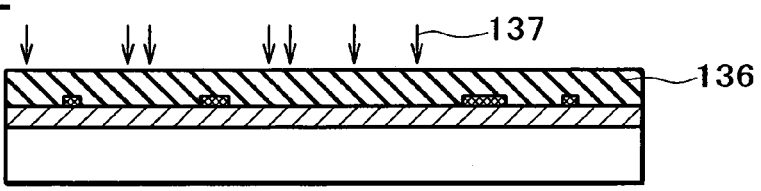
Figure 3F:
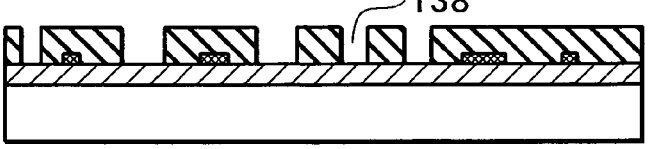
Figure 3G:
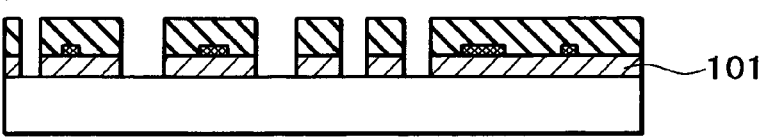
Figure 3H:
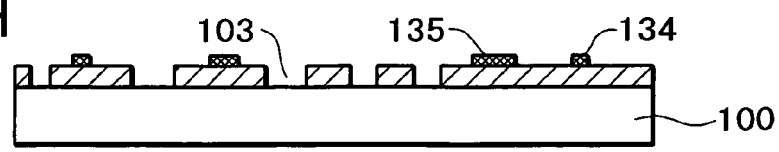

FIGS. 3A to 3H illustrate conventional tri-tone halftone mask fabricating processes wherein both auxiliary patterns and light shielding zones are formed using Cr. As shown in FIG. 3A, halftone film 101, Cr film 130, and resist 131 are formed in this order on a glass substrate 100 and exposure (EB) is performed at 132 for forming both auxiliary pattern and light shielding zone, followed by development to form resist patterns 133 as sown in FIG. 3B and subsequent etching to transfer the resist patterns to Cr as shown in FIG. 3C. Thereafter, the resist is removed, followed by washing, to form an auxiliary pattern 135 and a light shielding zone pattern 134 as shown in FIG. 3D. Then, as shown in FIG. 3E, resist 136 is applied and exposure is made (EB) at 137 for circuit patterns. Subsequently, development is made to form resist patterns as shown in FIG. 3F and etching is performed to transfer the circuit patterns to the halftone phase shift film 101 as shown in FIG. 3B. Subsequent removal of the resist and washing afford a tri-tone halftone mask with auxiliary pattern 135 and light shielding zone pattern 134 formed thereon using Cr (FIG. 3H).

Thus, in the above conventional method, the auxiliary pattern is first formed, so if the halftone phase shift film later formed is defective, the auxiliary pattern forming step becomes a wasteful step. The reason why it has so far been required to perform the auxiliary pattern forming step first is as follows. Where this step is conducted first, it is necessary to perform Cr etching in the halftone aperture and conduct a halftone film processing and subsequently perform Cr etching in the other field portion than the auxiliary pattern portion and light shielding zone portion. In this etching step the halftone film and the glass substrate are partially etched, with consequent deterioration of the phase and transmittance controlling accuracy and of the intra-plane uniformity.

According to the invention wherein steps low in yield are preceded and only a good product is subjected to the next step, it was possible to reduce the number of manufacturing steps in comparison with the conventional method, decrease the mask cost, quicken the mask feed TAT, and improve the production yield.

Second Exemplary Embodiment

A description will be given below in detail about the procedure used in a photomask fabricating method according to a second exemplary embodiment of the invention.

FIG. 4 shows a manufacturing process flow according to this preferred embodiment. First, there is provided a halftone blank having a halftone phase shift film formed on a transparent substrate (201) and resist is applied onto the blank (202).

A halftone pattern (circuit pattern) is plotted (203) followed by development (204) and subsequent etching (205).

The resist is removed by ashing and cleaning is performed (206).

The appearance and dimension of the pattern are checked (207) to complete a matrix mask. A matrix mask rejected in this inspection is subjected to correction if possible, whereas a rejected matrix mask incapable of being corrected is again subjected to the step of providing a halftone blank (201) and subsequent steps described above to complete a matrix mask. Thereafter, a light absorbing resist is applied (208), then an auxiliary pattern and a light shielding zone pattern (both designated patch patterns) are plotted (209), followed by development (210) to form both auxiliary pattern and light shielding zone pattern which are constituted by the resist. Then, appearance and dimension are checked (211). A mask which has passed the inspection becomes a completed mask (212), while a mask rejected in the inspection has its resist removed by ashing and cleaning (213) and is then subjected again to the steps beginning with the step of applying a light absorbing resist (208). In the event a design error is found in the auxiliary pattern or if a design modification for the auxiliary pattern is found necessary as a result of mask transfer evaluation, the mask concerned goes through the resist removal and cleaning steps (213) and undergoes the steps beginning with the light absorbing resist application step (208). In this case, the patch patterns to be plotted (209) should be the design-modified patterns.

FIG. 5 shows a conventional process flow for fabricating a tri-tone halftone phase shift mask. A halftone blank with Cr is provided (301), then resist is applied (302), patch patterns are plotted (303), followed by development (304), Cr etching (305), removing the resist by ashing and cleaning (306), and subsequent check of mask appearance and dimension (307). A matrix mask rejected in the inspection is corrected if possible, while if a rejected matrix mask is incapable of being corrected, it is again subjected to the steps beginning with step (301).

A matrix mask which has passed the inspection then goes through the steps of resist application (308), plotting a halftone pattern (circuit pattern) (309), development (310), halftone film etching (311), resist removal and cleaning (312), and subsequent check of appearance and dimension (313). If the mask passes the inspection, it becomes a completed mask (314). On the other hand, if the mask is rejected, it is corrected if possible, while if the correction is impossible, the rejected mask is again processed from the beginning (the step of providing a halftone blank with Cr (301)).

Assuming that the yield in each step is high and that the inspection is passed 100%, there are eleven steps in this preferred method of the present invention, while thirteen steps are included in the conventional method, showing that the manufacturing process can be shortened by the method of the invention.

When such a dimensional accuracy as 10 nm is required, the dimensional yield of a circuit pattern becomes as low as 10–30%. On the other hand, such patch patterns as an auxiliary pattern and a light shielding zone pattern do not exert so much influence on the transfer dimension to wafer, such a high accuracy is not required. For this reason, the patch pattern forming yield is not less than 90%. When this yield is taken into account and when the circuit pattern forming yield and patch pattern fabrication yield are 30% and 90%, respectively, a total of 27.8 steps are required probabilitywise (on the average) to complete a single mask in the invention. On the other hand, in the case of a conventional mask, 45.9 steps are required. If the circuit pattern forming yield and the patch pattern fabrication yield are assumed to be 10% and 90%, respectively, 74.5 steps are required in the invention and 137.8 steps required in the conventional method. Thus, there arises a substantially large difference in the number of steps. Consequently, according to the invention, the mask cost greatly decreases and the mask feed TAT becomes very short.

Figure 15:
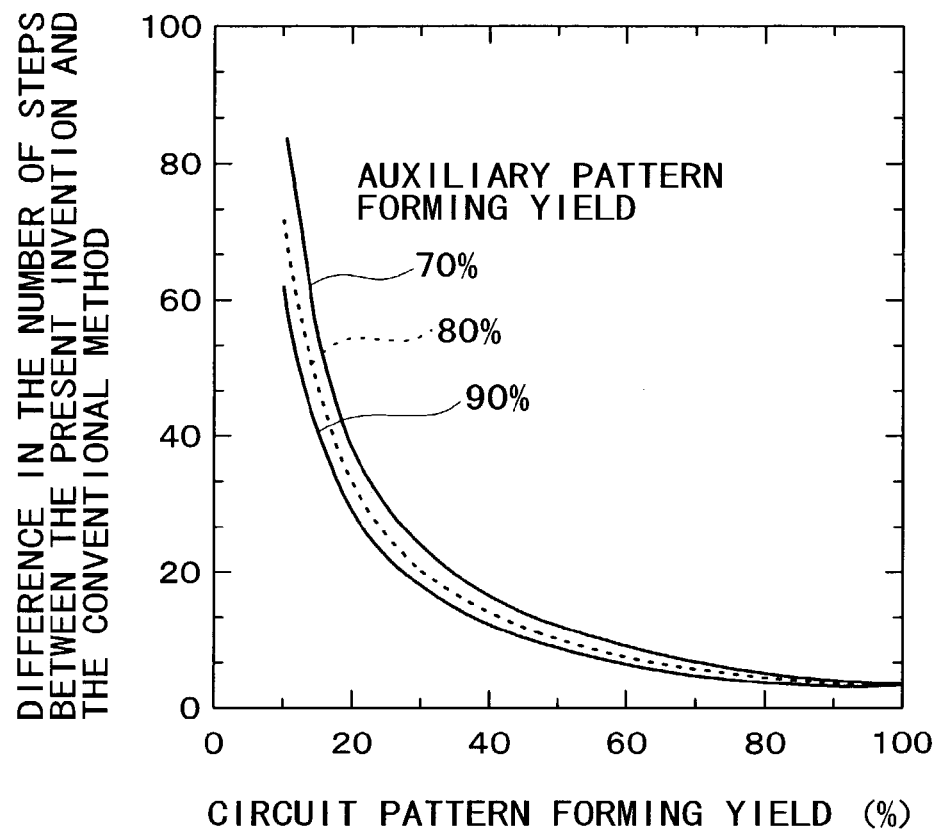
FIG. 15 is a characteristic diagram showing the effect of a preferred method the present invention.

FIG. 15 shows how the difference in the number of steps between the invention and the conventional method is related to the circuit pattern forming yield, with the patch pattern (auxiliary pattern) fabrication yield as a parameter. When the circuit pattern forming yield drops to below 40%, the difference in the number of steps widens abruptly and the effect of the invention becomes outstanding abruptly.

In the invention, after the formation of a matrix mask of circuit patterns, it is possible to re-fabricate the patch pattern in the form of re-utilizing the matrix mask. The time required for the change of patch pattern can be greatly shortened thereby. For example, in the above example according to the invention, when the circuit pattern forming yield and patch pattern fabrication yield are assumed to be 30% and 90%, respectively, 74.4 steps are required in the conventional method, while only 6.1 steps are required in the method of the invention. Thus, according to the invention, the amount of masks discarded becomes smaller and thus there accrues an effect also from the standpoint of environmental protection. Improvement of the mask feed TAT is useful particularly in shortening the period for the development of LSI and for grade development.

Third Exemplary Embodiment

Figure 6A:
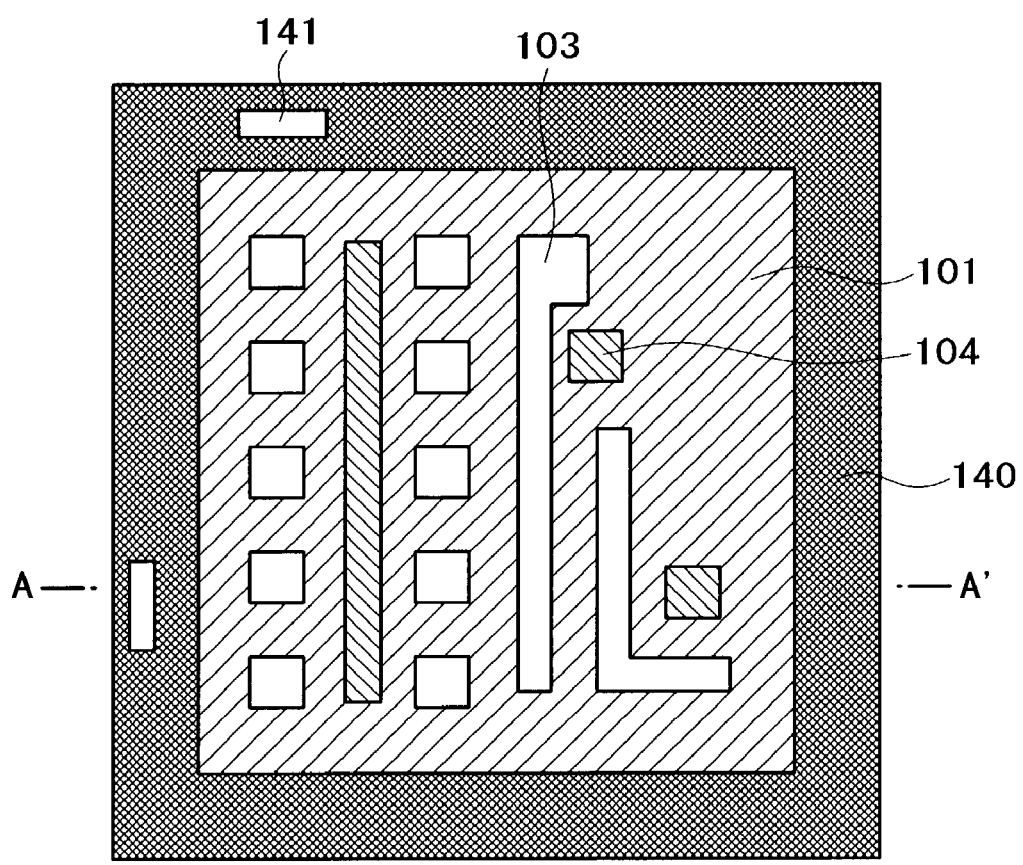
FIG. 6A is a plan view of a preferred structure of a photomask used of the present invention.
Figure 6B:
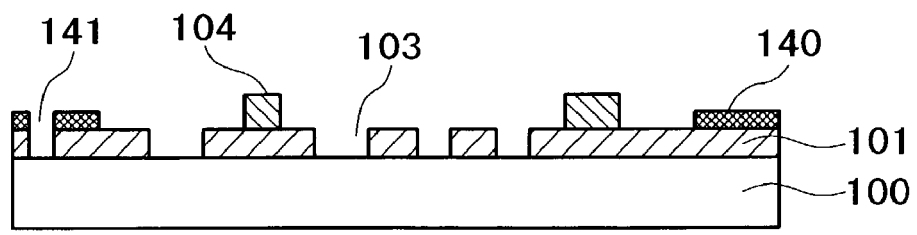
FIG. 6B is a sectional view along line A–A' of FIG. 6A.

FIG. 6A and 6B are structural diagrams of a photomask according to a third exemplary embodiment of the invention, in which FIG. 6A is a top view and FIG. 6B is a sectional view taken on line A–A' in FIG. 6A. In FIGS. 6A and 6B, the reference numeral 140 denotes a metallic outer frame. Reticle marks 141 for mask (reticle) alignment are formed in the outer frame. The function of the light shielding zone is also incorporated in the outer frame. As the metal, Cr is used here. Numeral 103 denotes a main circuit pattern, numeral 100 denotes a glass substrate, and numeral 101 denotes a halftone film. An auxiliary pattern 104 comprises resist as in the first exemplary embodiment. For example in the event a sub peak transfer is found after fabrication of an ordinary halftone mask and upon checking its transfer characteristic, this matrix mask according to this preferred embodiment is effective particularly in point of feed TAT and cost. The reason is that if a resist is applied onto this matrix mask, followed by plotting and development, a tri-tone mask with an auxiliary pattern can be produced. As the resist, it is necessary to use a resist which exhibits a light absorbing property against wafer exposure light. Alternatively, in case of an auxiliary pattern being a fine pattern smaller than a transferable size, there also may be used a film transparent to wafer exposure light, provided the resist film thickness is set to a film thickness corresponding to phase inversion of the wafer exposure light.

In ArF lithography, since the sub peak transfer preventing function of resist is insufficient, there may occur the transfer of a sub peak even in the case where the transmittance of a halftone film is as low as 4%, thus requiring an additional auxiliary pattern. Therefore, this method is useful especially in making a minor modification, for example, when switching from KrF lithography to ArF lithography or when pattern shrink is performed on the basis of a mask having exhibited satisfactory results in the past in KrF lithography to form a mask for ArF lithography.

Fourth Exemplary Embodiment

Figure 7A:
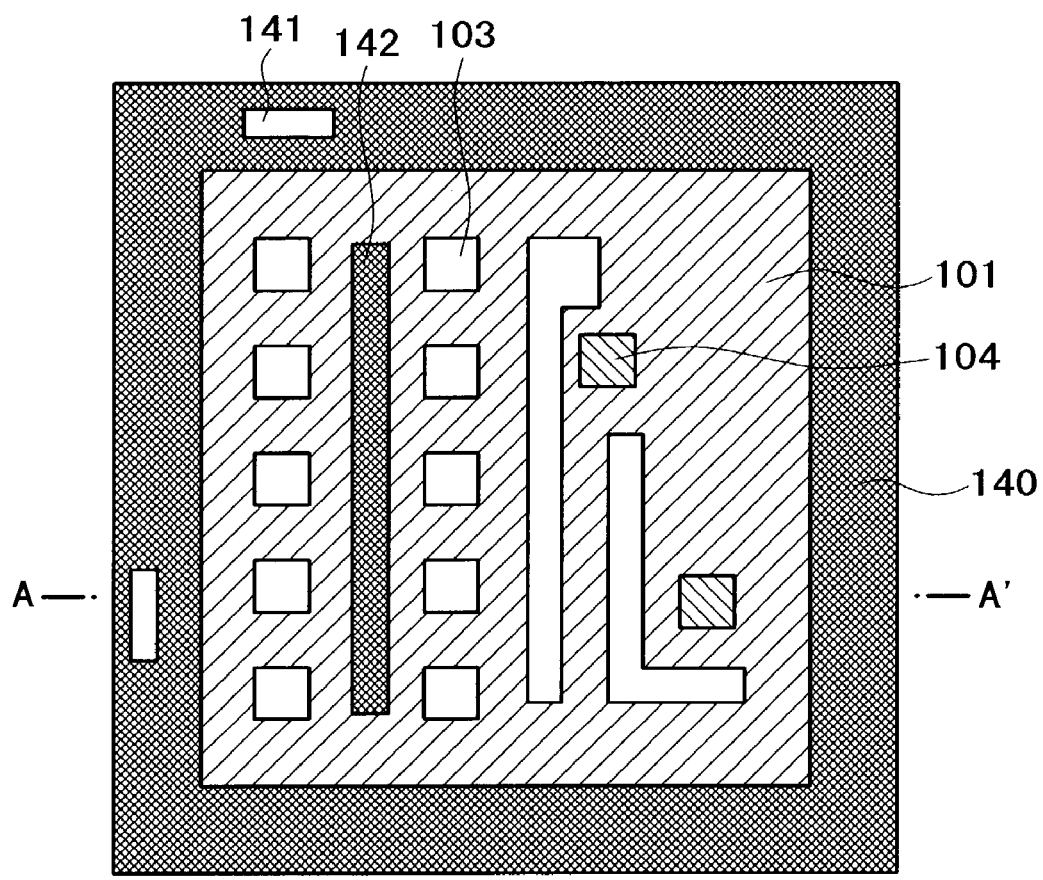
FIG. 7A is a plan view of a preferred structure of a photomask of the present invention.
Figure 7B:
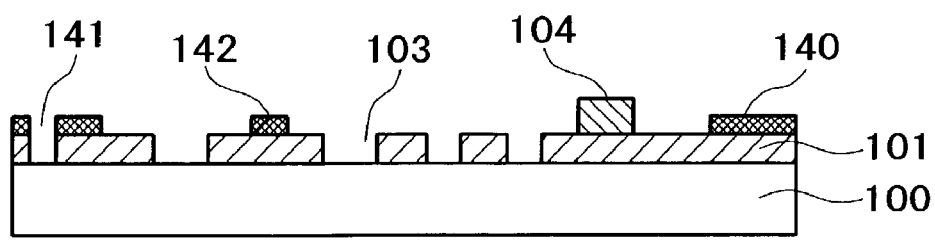
FIG. 7B is a sectional view along line A–A' of FIG. 7A.

FIG. 7A and 7B are structural diagrams of a photomask according to a fourth exemplary embodiment of the invention, in which FIG. 7A is a top view and FIG. 7B is a sectional view taken on line A–A' in FIG. 7A. The numeral 140 denotes a metallic outer frame. Reticle marks 141 for mask (reticle) alignment are formed in the outer frame 140. The function of the light shielding zone is also incorporated in the outer frame. Numeral 103 denotes a main circuit pattern, numeral 100 denotes a glass substrate, and numeral 101 denotes a halftone film.

An auxiliary pattern comprises an auxiliary pattern 142 and an auxiliary pattern 104 as a resist pattern. For example, in the event a sub peak transfer is found after fabrication of an ordinary tri-tone halftone mask having a metallic auxiliary pattern and upon checking its transfer characteristic, the mask according to this preferred embodiment is effective particularly in point of feed TAT and cost. The reason is that a mask with corrected auxiliary pattern can be fabricated easily by applying a resist onto this matrix mask and by subsequent plotting and development. As the resist, it is necessary to use a resist which possesses a light absorbing property against exposure light. Alternatively, in the case where the auxiliary pattern is a fine pattern smaller than the transferable size, a film which is transparent to the wafer exposure light is preferably used insofar as the resist film thickness is set to a thickness at which the phase of the wafer exposure light reverses.

Fifth Exemplary Embodiment

Figure 8:
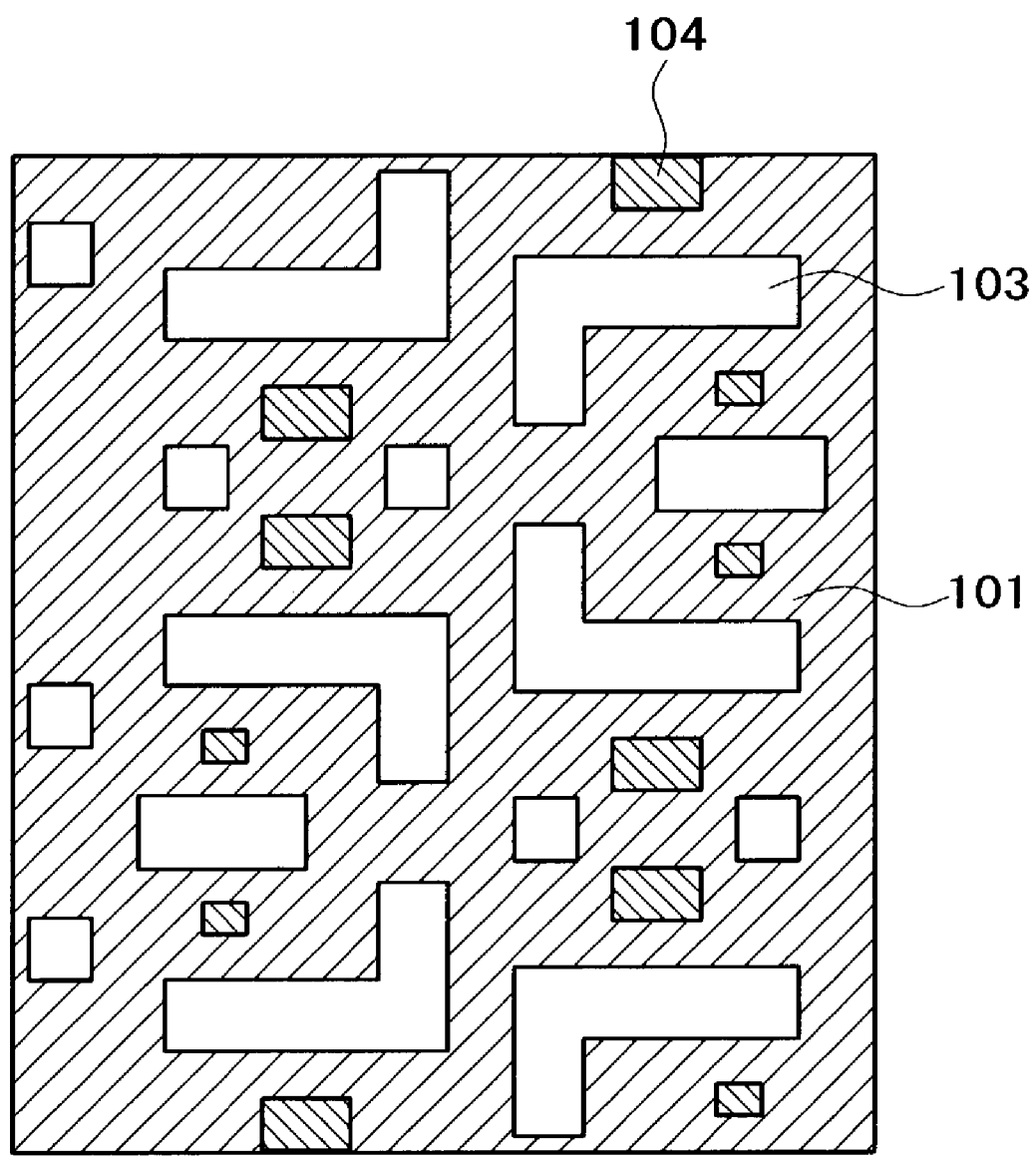
FIG. 8 is a top view of a pattern layout diagram showing an example of the arrangement of preferred auxiliary patterns according to the present invention.
Figure 9:
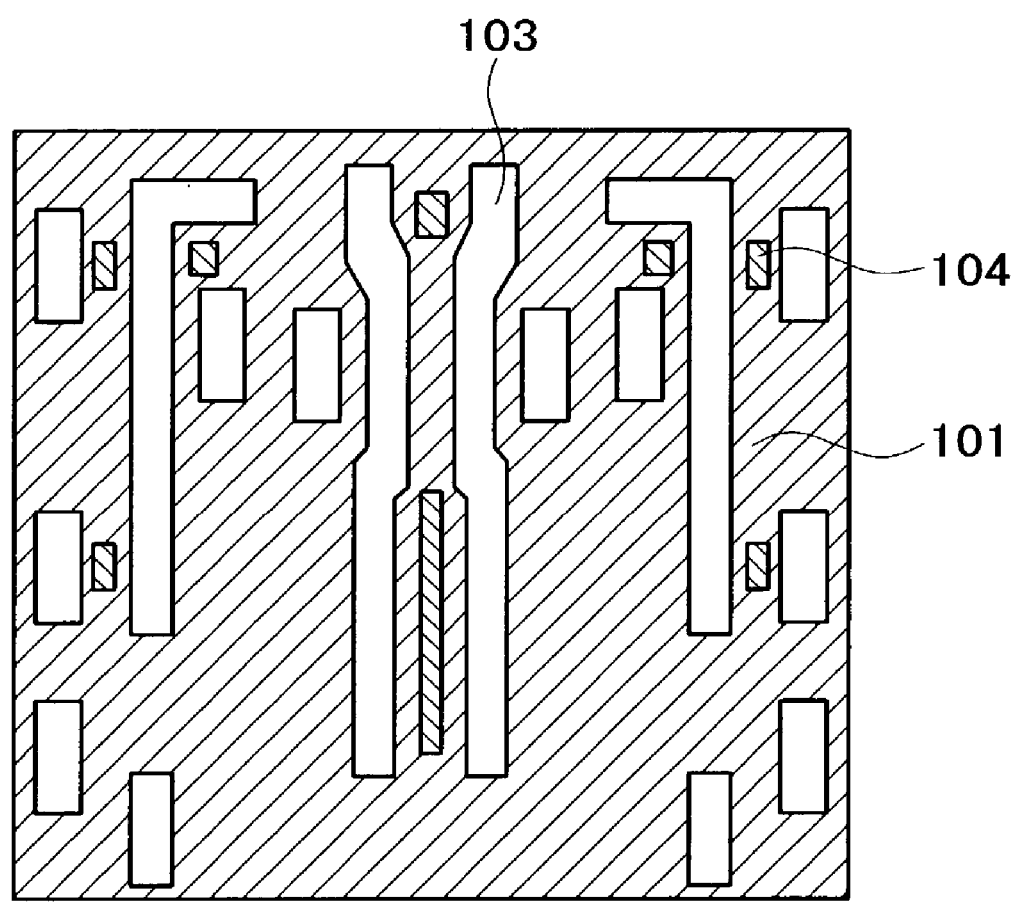
FIG. 9 is a top view of a pattern layout diagram showing an example of the arrangement of preferred auxiliary patterns according to the present invention.

Layout examples of auxiliary patterns will now be described with reference to FIGS. 8 to 10 which are top views showing preferred pattern layout examples. FIGS. 8 and 9 show layout examples of wiring patterns. In the figures, the numeral 101 denotes a halftone film, numeral 103 denotes a circuit pattern (aperture pattern) and numeral 104 denotes an auxiliary pattern as a resist pattern. The auxiliary pattern is disposed at a sub peak generated position anticipated by optical image simulation, in which position light rays from surrounding aperture patterns are condensed by interference. As to typical sizes, a minimum line width of the main circuit pattern is not larger than $(0.45 \times \lambda)/NA$ and the auxiliary pattern is also not larger than that size, typically one third to three fourths of the minimum main circuit size, at which the invention exhibits a specially outstanding effect. The larger the size of the auxiliary pattern, the more difficult the occurrence of sub peak becomes, but the halftone effect, i.e., resolution improving effect, diminishes.

Particularly, in the case where the minimum line width of the main circuit pattern is not larger than (0.4×λ)/NA, the effect of a halftone mask combined with the auxiliary pattern becomes outstanding. NA stands for a numerical aperture of a projection lens in stepper or scanner and λ stands for an exposure wavelength.

Figure 10A:
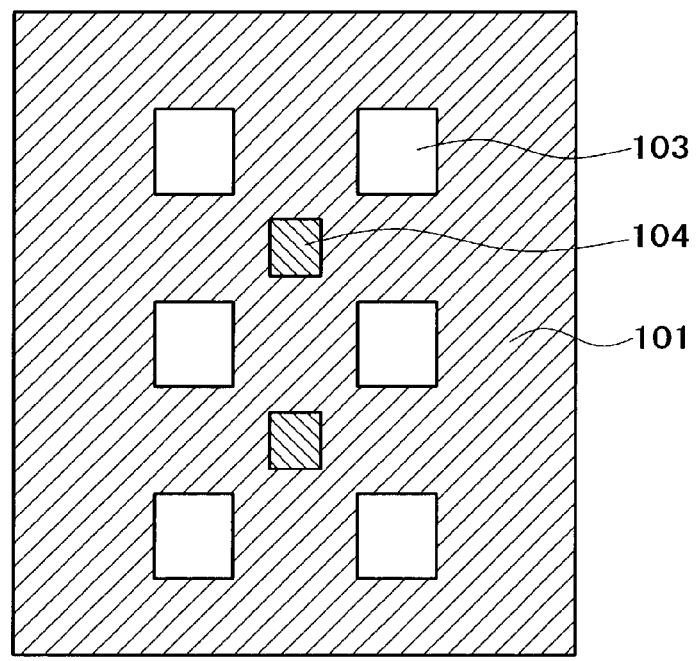
FIGS. 10A and 10B are top views of pattern layout diagrams showing examples of arrangements of preferred auxiliary patterns according to the present invention.
Figure 10B:
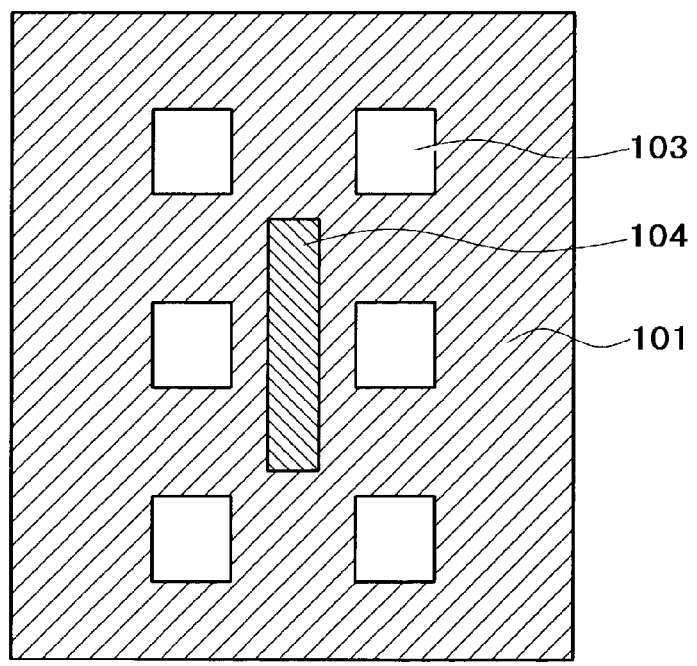

FIGS. 10A and 10B show an example of a hole pattern. In FIG. 10A, the place where an auxiliary pattern 104 is located is called quadrupole. In this place, diffracted light rays from surrounding apertures 103 gather in phase and there occurs a sub peak. The auxiliary pattern 104 is disposed there. In FIG. 10B, an auxiliary pattern 104 is disposed in a bar shape at a position which includes the aforesaid quadrupole. In the arrangement of FIG. 10A, the halftone area is wide and the resolution improving effect of hole 103 was outstanding. On the other hand, the bar-like arrangement of FIG. 10B was characteristic in that the size of the auxiliary pattern 104 was larger and the burden for plotting was small.

Sixth Exemplary Embodiment

A sixth exemplary embodiment of the invention is concerned with the manufacture of a semiconductor integrated circuit device having a CMIS (Complimentary MIS) circuit of a twin well type. A manufacturing process for the semiconductor integrated circuit device will be described below with reference to FIGS. 12A to 12F.

FIGS. 12A to 12F are sectional views of a principal portion of a semiconductor wafer in the manufacturing process.

Figure 12A:
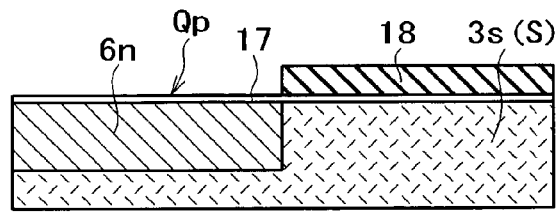
FIGS. 12A to 12F are process diagrams for a preferred manufacturing method of the present invention of a semiconductor integrated circuit device, with a principal portion being shown in section.

A semiconductor substrate 3s which constitutes the semiconductor wafer is, for example, a single crystal of Si of n-type having a circular plane. For example, an n-well 6n and a p-well 6p are formed on the semiconductor substrate 3s. For example, phosphorus or As is introduced into the n-well 6n as n-type impurity, while boron is introduced into the p-well 6p as p-type impurity. The n-well and p-well are formed in the following manner. First, a wafer alignment mark for mask alignment is formed (not shown) on the semiconductor substrate 3s. The wafer alignment mark may be formed at the time of forming the wells by adding a selective oxidation step. Thereafter, as shown in FIG. 12A, an oxide film 17 is formed on the semiconductor substrate 3s and subsequently a resist pattern 18 for implantation mask is formed on the oxide film 17 by i-line lithography. The mask is an ordinary Cr mask. Thereafter, phosphorus is implanted. The reason why the inexpensive i-line lithography is used is that the minimum size is as large as 2.4 μm and that a high dimensional accuracy is not required.

Figure 12B:
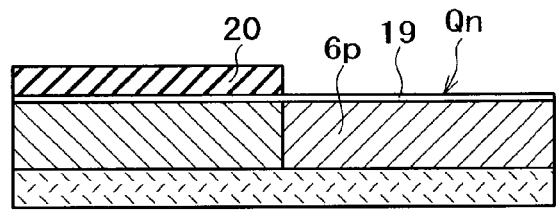

By subsequent ashing, the resist 18 is removed and so is the oxide film 17. Then, as shown in FIG. 12B, an oxide film 19 is formed on the semiconductor substrate 3s and subsequently a resist pattern 20 for implantation mask is formed on the oxide film 19 by i-line lithography. The mask is an ordinary Cr mask. Thereafter, phosphorus is implanted.

Figure 12C:
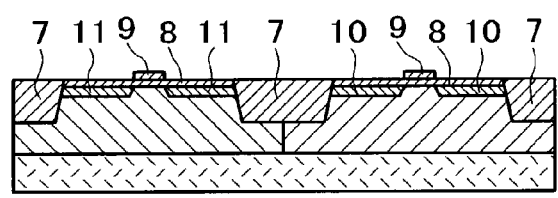
Figure 16:
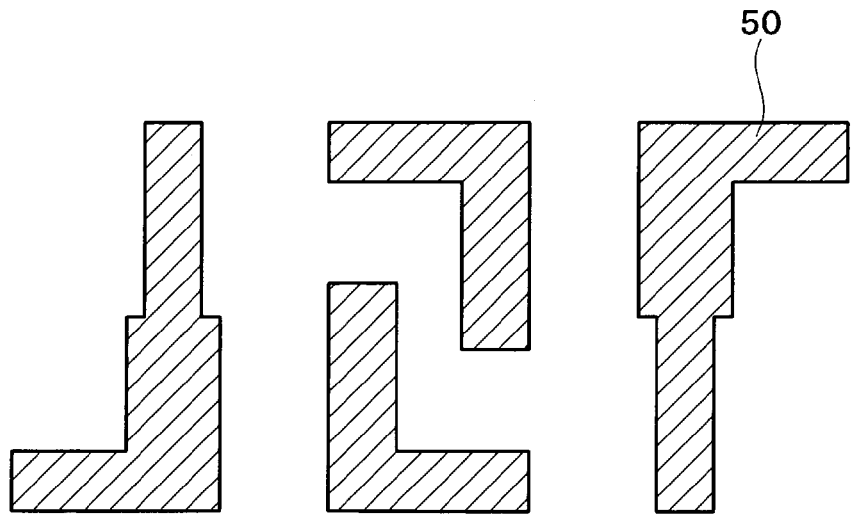
FIG. 16 is a layout diagram showing an example of the arrangement of preferred isolation patterns of the present invention.

Then, the resist 20 and the oxide film 19 are removed and a field insulating film 7 for isolation, e.g., a silicon oxide film, is formed in the form of a channel-like isolation (FIG. 12C). An isolation layout pattern is shown in FIG. 16, in which the numeral 50 denotes a pattern of an active region.

Figure 13:
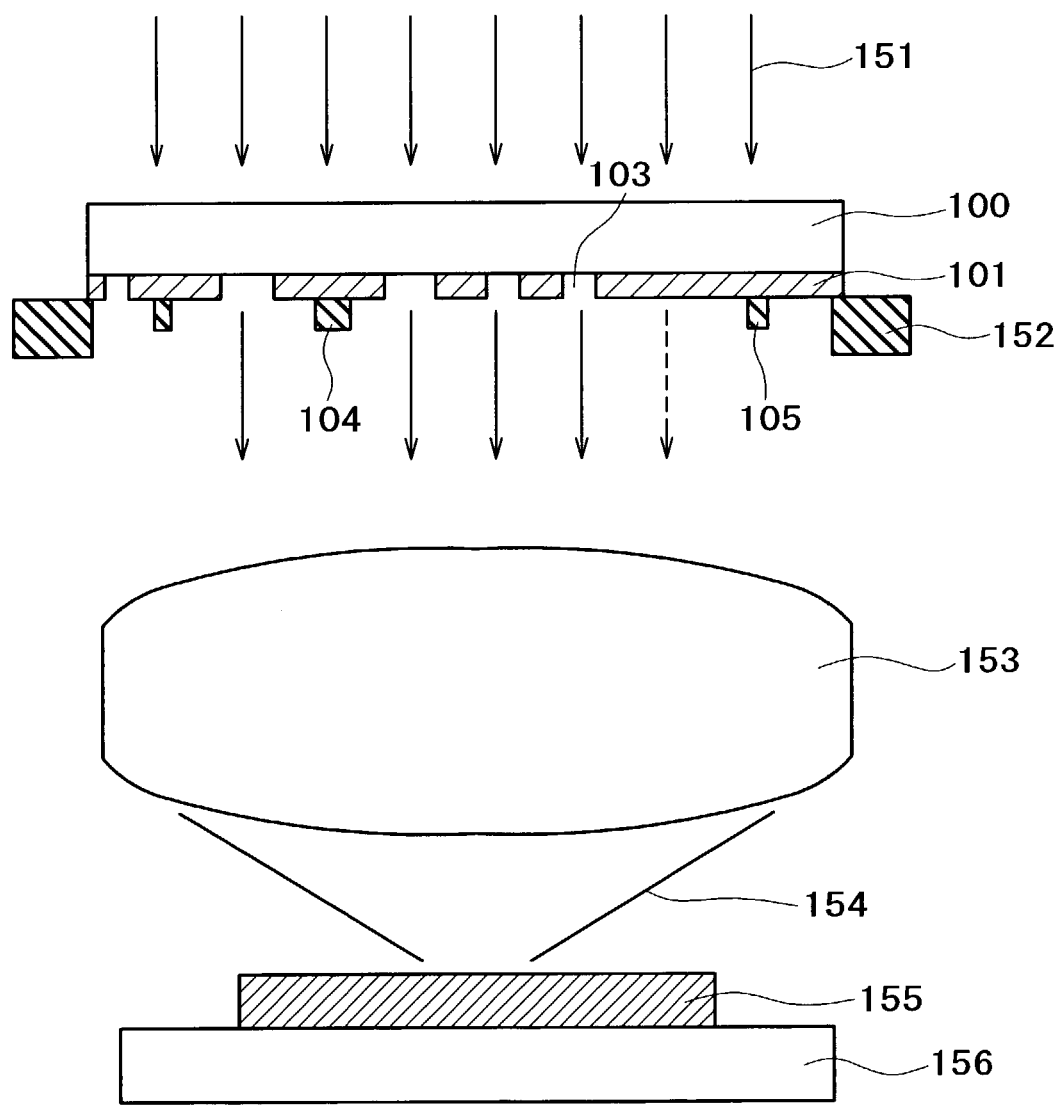
FIG. 13 is an explanatory diagram showing a construction in which exposure was conducted according to a preferred method of the present invention.
Figure 14:
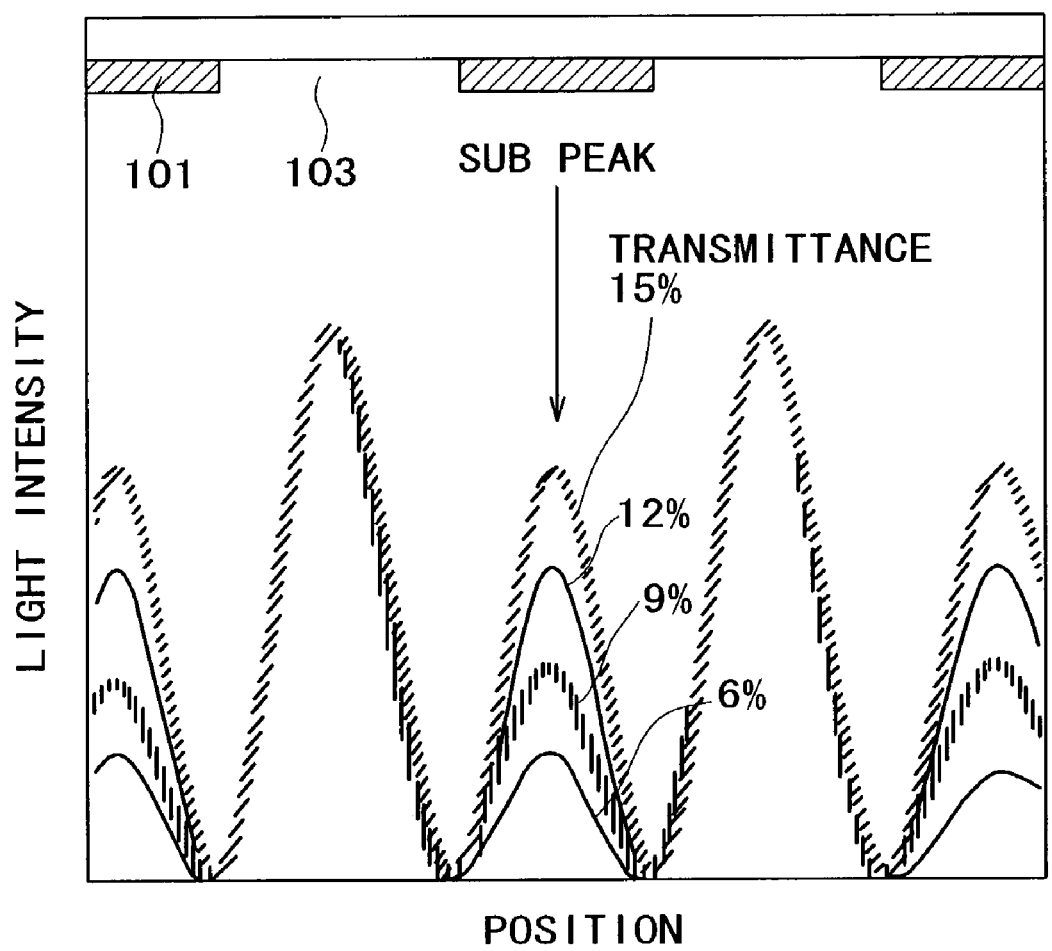
FIG. 14 is a diagram explanatory of development to be effected according to a preferred method of the present invention.

As a preferred isolation method, there may be used LOCOS (Local Oxidization of Silicon) method. However, the LOCOS method involves the problem that the layout size becomes large for example because of elongation of bird's beak. For the lithography in fabricating the isolation there was used an ArF excimer laser reduction projection exposure system and the halftone phase shift mask with auxiliary resist pattern described in the first exemplary embodiment. This is because the minimum size required for the mask was as small as 520 nm (130 nm on wafer) and the dimensional accuracy was 13 nm and thus strict. At this time, exposure was performed as shown in FIG. 13. That is, the photomask shown in the first exemplary embodiment was set on a mask stage 152 such that the main surface with patterns disposed thereon faced down, then exposure light (in this case, ArF excimer laser beam) 151 was radiated to the upper surface, and pattern exposure was performed for a wafer 155 placed on a wafer stage 156 through a projection lens 153. The numeral 154 in the figure represents in what state the exposure light is condensed. The projection lens 153 is a lens used in an optical reduction projection system. The reduction ratio was set at 4×, provided there is made no limitation to this value of reduction ratio. For example, the reduction ratio may be 5×, 2.5×, or 10×. The auxiliary pattern 104 and the light shielding zone pattern 105 are formed by resist, but the light radiated is attenuated light through the halftone film 101 and the wafer exposure is conducted through the reduction projection system, so the illuminance on the mask is lower than that on the wafer by an amount corresponding to the reduction ratio. For this reason the resist is little damaged by the irradiation of light. Since the transmittance of the halftone film is here set at 6%, the illuminance which the auxiliary resist pattern and the light shielding zone resist pattern undergoes becomes as small as (¼)×(¼)×0.06×(⅙.₆)=0.0063 as compared with the resist on wafer, in which 0.6 represents the transmittance of the projection lens 153.

In the active region surrounded with the field insulating film 7, there are formed nMIS Qn and pMIS Qp.

Figure 17:
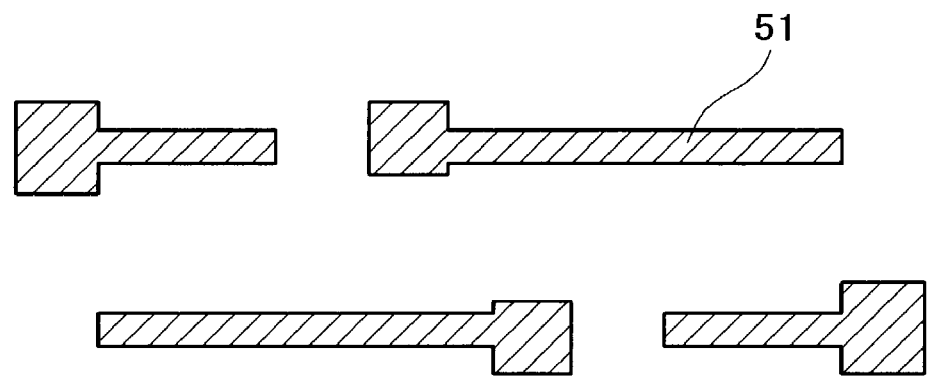
FIG. 17 is a layout diagram showing an example of the arrangement of preferred gate electrode patterns of the present invention.

Gate insulating films 8 of the nMIS Qn and pMIS Qp are, e.g., silicon oxide films and are formed by a thermal oxidation method as an example. Gate electrodes 9 of the nMIS Qn and pMIS Qp are each formed, for example, by the steps of depositing a gate forming film using, e.g., a low resistance polysilicon by CVD, then subjecting the film to lithography using an ArF excimer laser reduction projection exposure system and the halftone phase shift mask using an auxiliary resist pattern described in the first exemplary embodiment, and subsequent etching. In this case, the ArF excimer laser reduction projection exposure system used in the lithography may be substituted by a KrF excimer laser reduction projection exposure system. FIG. 17 shows a layout pattern of gate electrodes. Numeral 51 in the same figure denotes a gate wiring pattern.

However, with use of an ArF excimer laser which is shorter in exposure wavelength, a fine pattern can be resolved with exposure latitude. Since the gate is required to have a high dimensional accuracy, the mask production yield is low and in this point the use of the mask in question was particularly useful. The accuracy required for a gate circuit pattern is 9 nm on mask and a mask meeting this required accuracy could be fabricated at the fifth formation of circuit pattern. As a result, the number of mask fabricating steps was 35. With the ordinary tri-tone halftone mask, 65 steps are required. Thus, there were attained cost reduction and improvement of mask feed TAT.

Referring back to FIG. 12C, a semiconductor region 10 in the nMIS Qn preferably is formed by an ion implantation method self-alignmentwise for the gate electrode 9 by introducing phosphorus or arsenic into the semiconductor substrate 3s with the gate electrode 9 as a mask. Likewise, a semiconductor region 11 in the pMIS Qp preferably is formed by an ion implantation method self-alignmentwise for the gate electrode 9 by introducing boron into the semiconductor substrate 3s with the gate electrode 9 as a mask. The gate electrode 9 is not limited to being formed by an individual film of a low resistance polysilicon, but various changes may be made. For example, a polycide structure preferably may also be adopted in which a silicide layer such as a layer of tungsten silicide or cobalt silicide is formed on a low resistance polysilicon film. Also, a polymetal structure also may be preferably adopted in which a metal layer such as a layer of tungsten is formed on a low resistance polysilicon film through a conductive barrier film such as a titanium nitride film or a tungsten nitride film.

Figure 12D:
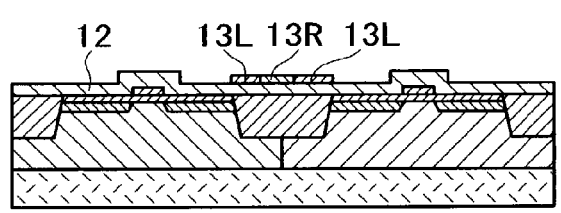

First, as shown in FIG. 12D, an interlayer insulating film 12, which is a silicon oxide film, is deposited on the semiconductor substrate 3s by CVD and thereafter a polysilicon film is deposited on an upper surface of the interlayer insulating film 12 by CVD, followed by lithography onto the polysilicon film and etching for patterning. Then, an impurity is introduced into a predetermined area of the thus-patterned polysilicon film. In this way wiring lines 13L and resistor 13R are formed by the polysilicon film.

Figure 12E:
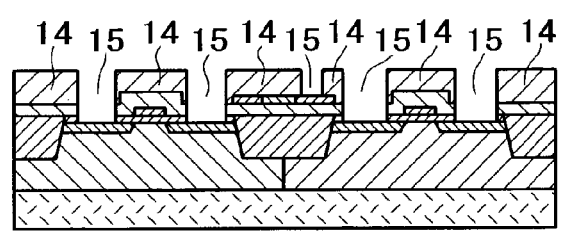
Figure 18:
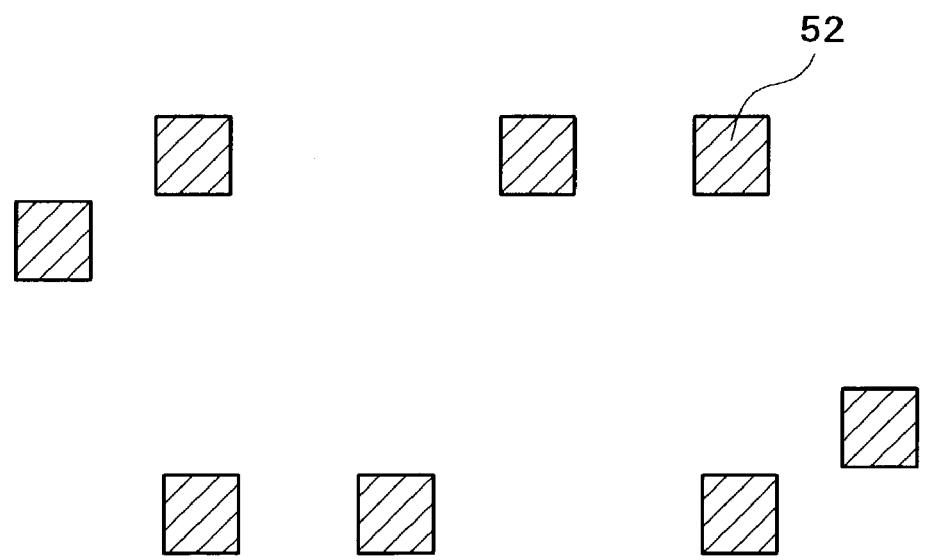
FIG. 18 is a layout diagram showing an example of the arrangement of preferred connecting hole patterns of the present invention.

Thereafter, as shown in FIG. 12E, a silicon oxide film 14 is deposited on the semiconductor substrate 3s by CVD and then connecting holes 15 by lithography and etching, using an ArF excimer laser reduction projection exposure system and the halftone mask with an auxiliary resist pattern described in the first exemplary embodiment such that the semiconductor regions 10, 11 and the wiring lines 13L are partially exposed to the interlayer insulating film 12 and the silicon oxide film 14. FIG. 18 shows a layout pattern of the connecting holes. Numeral 52 in the same figure represents a connecting hole pattern.

Since the connecting holes in the illustrated example are each 0.13 μm in diameter, ArF excimer laser exposure was used, but where a hole diameter larger than 0.16 μm is needed, KrF excimer laser exposure may be employed. Because of low equipment cost, the KrF excimer laser exposure is lower in cost than ArF lithography.

Figure 12F:
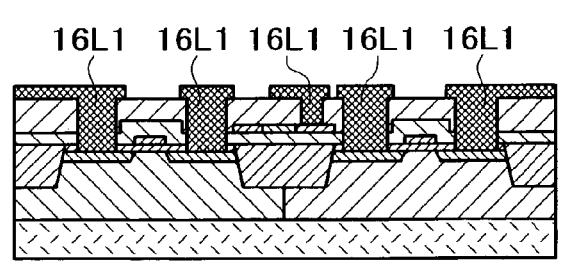
Figure 19:
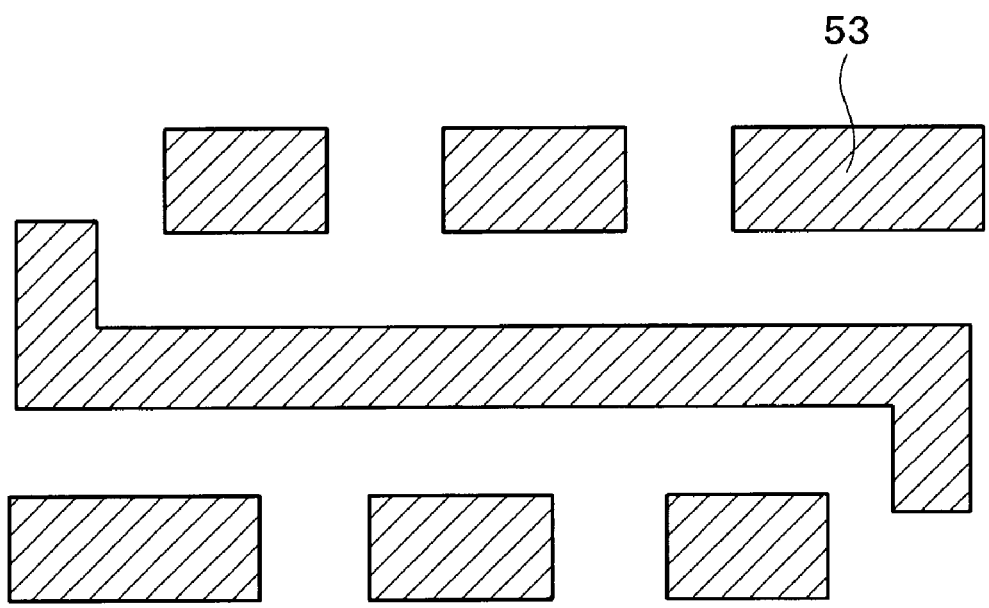
FIG. 19 is a layout diagram showing an example of the arrangement of preferred wiring patterns of the present invention.
Figure 20A:
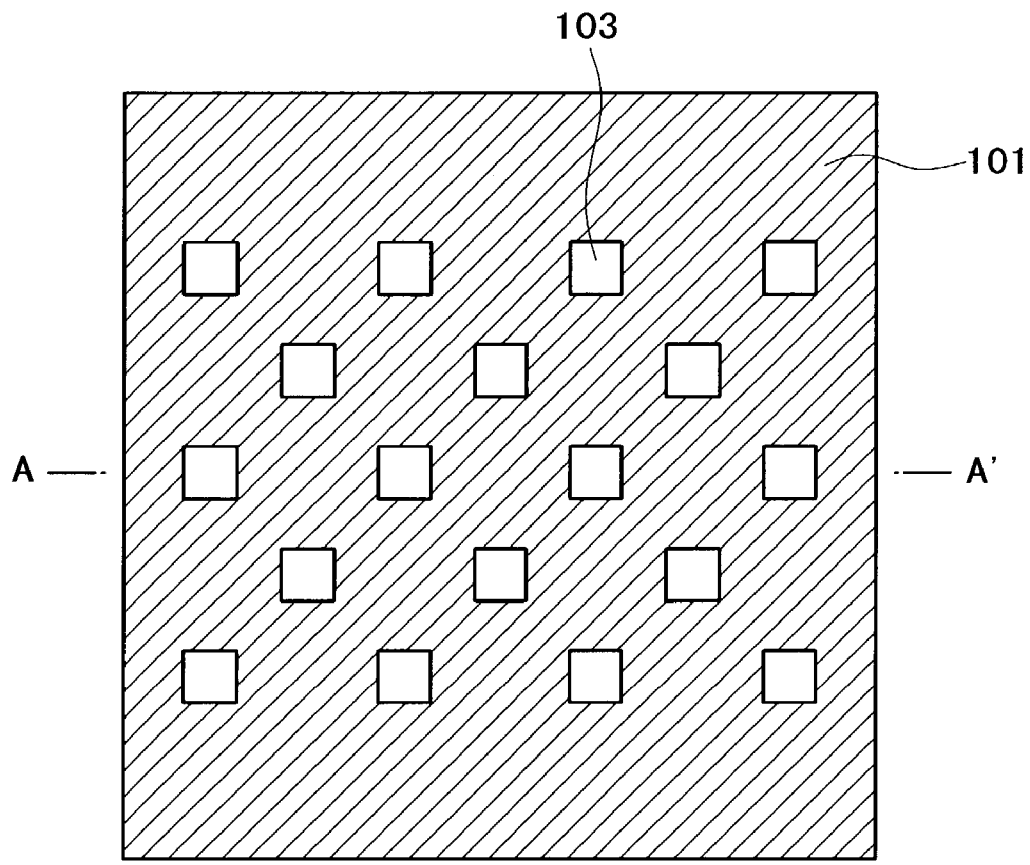
FIGS. 20A and 20B are layout diagrams showing an example of the arrangement of preferred quadrupole patterns of the present invention.
Figure 20B:
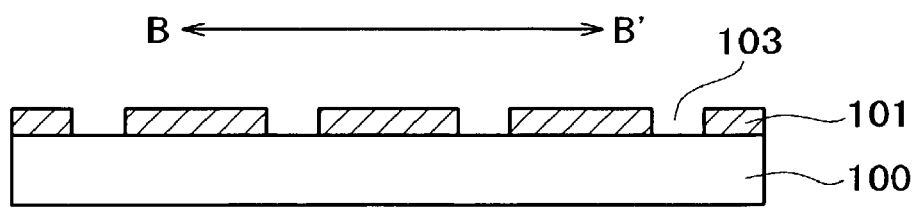

Further, a metallic film comprising titanium (Ti), titanium nitride (TiN), and tungsten (W) was deposited on the semiconductor substrate 3s successively by sputtering and CVD and was then subjected to lithography and etching, using an ArF excimer laser reduction projection system and the halftone mask with an auxiliary resist pattern described in the first exemplary embodiment to form first-layer wiring lines 16L1, as shown in FIG. 12F. Thereafter, second- and subsequent-layer wiring lines are formed like the first-layer wiring lines 16L1 to fabricate a semiconductor integrated circuit device. Because of a wiring pitch of 0.24 μm in the illustrated example, ArF excimer laser exposure was used. But in case of forming a wiring pitch pattern which is wider than 0.36 μm, KrF excimer laser exposure is preferably used from the standpoint of cost. FIG. 19 shows a layout example of wiring patterns. Numeral 53 in the same figure represents a wiring pattern.

In the case of a custom LSI product, mask debugging is often conducted, centered at the first wiring layer. Product development effectiveness depends on the speed of mask feed TAT for the first wiring layer and the number of masks required increases. Therefore, applying the mask of the invention, which is short in the mask feed TAT, to this process is particularly very effective.

Although the above description concerns the application to CMIS, this constitutes no limitation. The invention is also applicable to other electronic devices such as a semiconductor integrated circuit device having a memory circuit such as SRAM (Static Random Access Memory) or flash memory (EEPROM; Electric Erasable Programmable Read Only Memory), a mixed type semiconductor integrated circuit device having the above memory circuit and a logic circuit on one and same semiconductor substrate, a wiring substrate device, and a magnetic recorder.

The foregoing invention has been described in terms of preferred embodiments. However, those skilled, in the art will recognize that many variations of such embodiments exist. Such variations are intended to be within the scope of the invention and the appended claims.

Nothing in the above description is meant to limit the present invention to any specific materials, geometry, or orientation of elements. Many part/orientation substitutions are contemplated within the scope of the present invention and will be apparent to those skilled in the art. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A method of manufacturing an electronic device comprising:
   providing a halftone phase shift mask comprising:
   a mask substrate being transparent to exposure light;
   a translucent phase shift pattern formed on the mask substrate and having an aperture; and
   an auxiliary pattern, formed on the translucent phase shift pattern, disposed near the aperture and in an isolated manner, and having an organic film as a principal component, the organic film having a light attenuating property or a light shielding property against the exposure light;
   positioning the halftone phase shift mask with the auxiliary pattern facing towards a device substrate; and
   irradiating the exposure light to reach the auxiliary pattern after passing through the translucent phase shift pattern thereby forming a pattern on the device substrate.

2. The method according to claim 1, wherein the auxiliary pattern is disposed at a position on the mask corresponding to a sub peak generated position in a transfer image of the aperture to the substrate.

3. The method according to claim 1, wherein the organic film is formed using a negative type resist to provide an insoluble area after exposed to the exposure light.

4. The method according to claim 1, wherein the organic film comprises a phenolic resin or a novolak resin as a base resin.

5. The method according to claim 1, wherein the organic film comprises a resin which contains anthracene, naphthalene, phenanthrene, or a derivative thereof.

6. A method of manufacturing an electronic device comprising:
   providing a halftone phase shift mask comprising:
   a mask substrate being transparent to exposure light;
   a translucent phase shift pattern formed on the mask substrate and having an aperture; and
   an auxiliary pattern, formed on the translucent phase shift pattern using a photosensitive composition and disposed near the aperture and in an isolated manner, the photosensitive composition containing a radical forming agent which forms radicals against electron beam or light and also containing a black matrix;

positioning the halftone phase shift mask with the auxiliary pattern facing towards a device substrate; and irradiating the exposure light to reach the auxiliary pattern after passing through the translucent phase shift pattern thereby forming a pattern on the device substrate.

7. A method of manufacturing an electronic device comprising:

providing a halftone phase shift mask comprising:
a mask substrate being transparent to exposure light;
a translucent phase shift pattern for forming an isolation region for electrical isolation of circuit components from each other, the phase shift pattern being formed on the mask substrate and having an aperture; and
an auxiliary pattern formed on the translucent phase shift pattern and having an organic film as a principal component, the auxiliary pattern being disposed near the aperture and in an isolated manner, to diminish or prevent the generation of sub peaks in a transfer image of the aperture to a device substrate,
positioning the halftone phase shift mask with the auxiliary pattern facing towards a device substrate; and
irradiating the exposure light to reach the auxiliary pattern after passing through the translucent phase shift pattern thereby forming a pattern on the device substrate.

8. The method according to claim 7, wherein said translucent phase shift pattern is used for forming gate electrodes of plural MIS type transistors.

9. The method according to claim 8, wherein the formation of a pattern onto the device substrate is performed using an ArF excimer laser.

10. The method according to claim 7, wherein said translucent phase shift pattern is used for forming plural hole patterns.

11. The method according to claim 7, wherein said translucent phase shift pattern is used for forming a wiring pattern.

12. A method of manufacturing an electronic device, comprising the steps of:

providing a halftone phase shift mask manufactured according to a method comprising the steps of:
providing a transparent substrate having a translucent phase shift film formed thereon,
forming a pattern having an aperture in the translucent phase shift film,
judging whether the translucent phase shift film formed with the aperture is good or not, and
forming an auxiliary pattern near the aperture of the translucent phase shift film judged to be good, the auxiliary pattern having an organic film as a principal component;
mounting the halftone phase shift mask on a piojection exposure system such that the surface of the mask with the translucent phase shift film formed thereon faces down; and
transferring the pattern, formed on the halftone phase shift mask, onto a substrate disposed on a sample stage in the projection exposure system.

13. The method according to claim 12, wherein the aperture is formed by electron beam exposure.

14. The method according to claim 12, wherein the translucent phase shift film is formed of a material containing MoSix as a principal component.

15. The method according to claim 12, wherein the translucent phase shift film is subjected to patterning with use of a positive type resist.

16. The method according to claim 12, wherein the organic film comprises a phenolic resin or a novolak resin as a base resin.

17. The method according to claim 12, wherein the organic film comprises a resin which contains anthracene, naphthalene, phenanthrene, or a derivative thereof.

18. The method according to claim 12, wherein the organic film is photosensitive.

19. The method according to claim 12, wherein each of a plurality of auxiliary patterns is disposed in an isolated manner.

20. The method according to claim 12, wherein the auxiliary pattern is disposed at a position on the mask corresponding to a sub peak generated position in a transfer image of the aperture to the substrate.

21. The method according to claim 12, wherein the organic film comprises a negative type resist.

22. The method according to claim 12, wherein the organic film possesses a light attenuating property or a light shielding property against the exposure light.

23. A method of manufacturing an electronic device, comprising the steps of:

providing a halftone phase shift mask manufactured according to a method comprising the steps of:
providing a transparent mask substrate having a translucent phase shift film formed thereon,
forming in the translucent phase shift film an aperture which includes a device pattern and an alignment mark pattern, and
forming an auxiliary pattern with use of the alignment mark pattern, the auxiliary pattern having an organic film as a principal component and being formed on the translucent phase shift film, and the auxiliary pattern being formed near the aperture in the translucent phase shift film and disposed in an isolated manner;
mounting the halftone phase shift mask on a projection exposure system such that the surface of the mask with the translucent phase shift film formed thereon faces down; and
irradiating the exposure light to reach the auxiliary pattern after passing through the translucent phase shift pattern thereby transferring the pattern, formed on the halftone phase shift mask, onto a device substrate disposed on a sample stage in the projection exposure system.

24. A method of manufacturing an electronic device, comprising the steps of: transferring a pattern onto a first substrate by using a halftone phase shift mask, the halftone phase shift mask comprising a translucent phase shift pattern having an aperture and an auxiliary pattern disposed near the aperture, the auxiliary pattern having an organic film as a principal component which possesses a light attenuating property or a light shielding property against exposure light;

checking whether an unnecessary pattern has been transferred onto the first substrate;
providing, if an unnecessary pattern has been transferred, a halftone phase shift mask having a corrected auxiliary pattern, the corrected auxiliary pattern being obtained on the basis of information on the size and position of the unnecessary pattern; and
transferring a pattern onto a second substrate by using the halftone phase shift mask having the corrected auxiliary pattern.

25. A method of manufacturing an electronic device, comprising the steps of:

providing a halftone phase shift mask, the halftone phase shift mask comprising a translucent phase shift pattern having an aperture, an auxiliary pattern disposed near the aperture and having an organic film as a principal component which possesses a light attenuating property or a light shielding property against exposure light, and a light shielding zone disposed in a peripheral portion;

mounting the halftone phase shift mask on a projection exposure system such that the surface of the mask with the translucent phase shift pattern formed thereon faces down; and transferring the translucent phase shift pattern formed on the halftone phase shift mask onto a substrate disposed on a sample stage in the projection exposure system.

26. The method according to claim 25, wherein the light shielding zone comprises an organic film.

27. The method according to claim 25, wherein the light shielding zone comprises a chromium film.

28. The method according to claim 25, wherein the auxiliary pattern is formed by electron beam exposure.

29. The method according to claim 28, wherein a water-soluble conductive film is formed on a surface of the substrate and said surface is subjected to the electron beam exposure.

30. A method of manufacturing an electronic device, comprising:

providing a photomask comprising:

a mask substrate which is transparent to exposure light, a phase shift pattern formed on the mask substrate, being translucent to exposure light for forming a device pattern, and an auxiliary pattern comprising a photosensitive organic film, formed on the translucent phase shift pattern, and disposed in an isolated manner, positioning the photomask with the auxiliary pattern facing towards a device substrate; and irradiating the exposure light to reach the auxiliary pattern after passing through the phase shift pattern thereby forming the device pattern on the device substrate.

31. The method according to claim 30, wherein the photomask further comprises:

a plurality of isolated auxiliary patterns each comprising a photosensitive organic film.

32. The method according to claim 30, wherein the auxiliary pattern is disposed at a position on the mask corresponding to a sub peak generated position in a transfer image.

33. The method according to claim 30, wherein the auxiliary pattern comprises a negative type resist.

34. The method according to claim 30, wherein the auxiliary pattern attenuates or shields the exposure light.

35. A method of manufacturing an electronic device comprising:

providing a mask, which is fabricated according to a method comprising the steps of:

forming a phase shift film which is translucent to exposure light on a mask substrate which is transparent to exposure light, forming a device circuit pattern on the phase shift film, coating the mask substrate with a negative type photosensitive composition, exposing the negative type photosensitive composition to light, and making development to form an auxiliary pattern made of the photosensitive composition different from a main pattern on the phase shift film and disposed in an isolated manner;

positioning the mask with the auxiliary pattern facing towards a device substrate; and irradiating the exposure light to reach the auxiliary pattern after passing through the translucent phase shift pattern thereby forming a pattern on the device substrate.

36. A method of manufacturing an electronic device comprising:

providing a mask, which is fabricated according to a method comprising the steps of:

forming a phase shift film which is translucent to exposure light onto a mask substrate which is transparent to exposure light, forming a reference alignment mark pattern together with a device circuit pattern on the phase shift film, coating the mask substrate with a photosensitive composition, making alignment with reference to the reference alignment mark pattern and exposing an auxiliary pattern different from a main pattern to the photosensitive composition, and making development to form an auxiliary pattern made of the photosensitive composition on the phase shift film and disposed in an isolated manner;

positioning the mask with the auxiliary pattern facing towards a device substrate; and irradiating the exposure light to reach the auxiliary pattern after passing through the translucent phase shift pattern thereby forming a pattern on the device substrate.

37. A method of manufacturing an electronic device comprising the steps of:

providing a photomask having a mask substrate which is transparent to exposure light, a phase shift pattern which is formed on the mask substrate and translucent to the exposure light, and an auxiliary pattern which comprises a photosensitive organic film and is formed on the phase shift pattern and disposed in an isolated manner;

mounting the photomask on a projection exposure system such that a surface thereof faces down, positioning the photomask with the auxiliary pattern facing towards a device substrate; and irradiating the exposure light to reach the auxiliary pattern after passing through the translucent phase shift pattern thereby transferring a pattern onto the device substrate placed on a sample stage in the projection exposure system.

38. A method of manufacturing an electronic device, comprising the steps of:

forming a phase shift film which is translucent to exposure light on a substrate which is transparent to exposure light, forming a device circuit pattern on the phase shift film, coating the substrate with a negative type photosensitive composition, exposing an auxiliary pattern different from a main pattern to the negative type photosensitive composition, making development to form an auxiliary pattern of the negative type photosensitive composition, thereby providing a photomask, making a pattern exposure with use of the photomask, removing the negative type photosensitive composition, coating again the photomask with a negative type photosensitive composition, exposing an auxiliary pattern different from a main pattern to the negative type photosensitive composition, making development to form an auxiliary pattern of the negative type photosensitive composition, thereby providing a second photomask, mounting the second photomask on a projection exposure system such that a surface thereof faces down, and transferring a pattern onto a substrate placed on a sample stage in the projection exposure system.

39. A method of manufacturing an electronic device comprising the steps of: forming a phase shift film which is translucent to exposure light on a substrate which is transparent to exposure light, forming a device circuit pattern on the phase shift film, coating the substrate with a negative type photosensitive composition, exposing an auxiliary pattern different from a main pattern to the negative type photosensitive composition, making development to form an auxiliary pattern of the negative type photosensitive composition, thereby providing a photomask, making a pattern exposure with use of the photomask to produce a first electronic device, removing the negative type photosensitive composition, coating the photomask with a negative type photosensitive composition, exposing an auxiliary pattern different from a main pattern to the negative type photosensitive composition, making development to form an auxiliary pattern of the negative type photosensitive composition, thereby providing a second photomask, and making a pattern exposure with use of the second photomask to produce a second electronic device.

\* \* \* \* \*